US008110491B2

(12) United States Patent
Harada

(10) Patent No.: US 8,110,491 B2
(45) Date of Patent: Feb. 7, 2012

(54) METHOD OF MANUFACTURING SEMICONDUCTOR DEVICE AND SUBSTRATE PROCESSING APPARATUS

(75) Inventor: Kazuhiro Harada, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/457,915

(22) Filed: Jun. 25, 2009

(65) Prior Publication Data
US 2009/0325372 A1   Dec. 31, 2009

(30) Foreign Application Priority Data

Jun. 25, 2008  (JP) ................................. 2008-166405
May 13, 2009  (JP) ................................. 2009-116906

(51) Int. Cl.
H01L 21/3205    (2006.01)
H01L 21/4763    (2006.01)
H01L 21/8242    (2006.01)

(52) U.S. Cl. ......... 438/591; 438/240; 438/627; 438/643

(58) Field of Classification Search .................. 438/591, 438/3, 240, 622, 624, 627, 625, 643, 653, 438/648, 618
See application file for complete search history.

(56) References Cited

U.S. PATENT DOCUMENTS

| 5,682,041 A * | 10/1997 | Kawakubo et al. | 257/38 |
| 7,402,491 B2 * | 7/2008 | Choi et al. | 438/257 |
| 7,494,873 B2 * | 2/2009 | Forbes et al. | 438/259 |
| 2010/0221905 A1 * | 9/2010 | Hautala et al. | 438/591 |

OTHER PUBLICATIONS

Lee et al., "Ti-Al-N Thin Films Prepared by the Combination of Metallorganic Plasma-Enhanced Atomic Layer Deposition of Al and TiN," Electrochemical and Solid-State Letters, 2003, vol. 6, No. 5, pp. C70-C72.

Lee et al., "Controlling the composition of $Ti_{1-x}Al_xN$ thin films by modifying the number of TiN and AlN subcycles in atomic layer deposition," J. Vac. Sci. Technol. A., 2003, vol. 21, No. 5, pp. L13-L15.

* cited by examiner

Primary Examiner — Chuong A. Luu
(74) Attorney, Agent, or Firm — Oliff & Berridge, PLC

(57) ABSTRACT

A manufacturing method of a semiconductor device of the present invention includes the step of forming an insulating film on a substrate, and the step of forming a high dielectric constant insulating film on the insulating film, and the step of forming a titanium aluminum nitride film on the high dielectric constant insulating film, wherein in the step of forming the titanium aluminum nitride film, formation of an aluminum nitride film and formation of a titanium nitride film are alternately repeated, and at that time, the aluminum nitride film is formed firstly and/or lastly.

20 Claims, 13 Drawing Sheets

(a)          (b)

(a)

(b)

FIG. 10
SEM picture of TiAlN (After 900°C anneal)
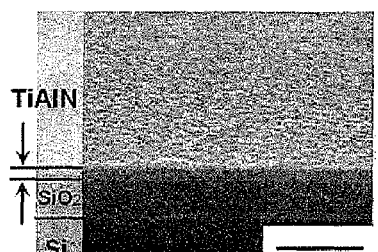
(a)
Cross-sectional TEM picture of TiAlN (After 900°C anneal)
(b)
AFM picture of TiAlN (After 900°C anneal)
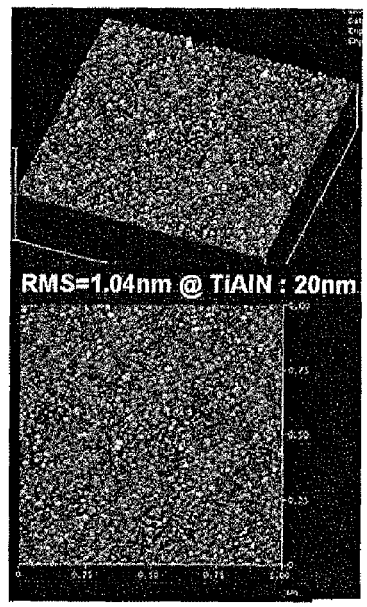
(c)
FIG. 11
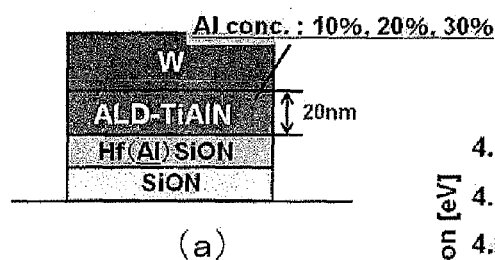
(a)
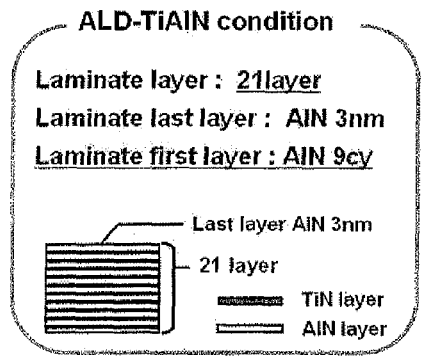
(b)
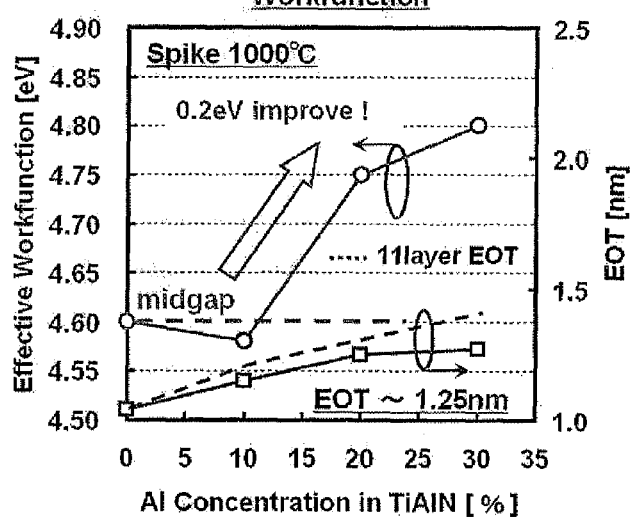
(c)

METHOD OF MANUFACTURING SEMICONDUCTOR DEVICE AND SUBSTRATE PROCESSING APPARATUS

BACKGROUND

1. Technical Field

The present invention relates to a manufacturing method of a semiconductor device and a substrate processing apparatus, and particularly relates to the manufacturing method of the semiconductor device including the step of forming a metal film on a substrate and the substrate processing apparatus for forming the metal film on the substrate.

2. Description of Related Art

In a Metal/High-k gate stack, when high-temperature heat treatment is applied, there is a problem that an effective work function of a metal gate electrode is shifted to midgap, due to Fermi-level pinning phenomenon. This phenomenon appears remarkably in p-MOSFET in particular. As a method of avoiding this phenomenon, research of using a metal composite film, such as a Metal-Al—N film, in the gate electrode, has been recently conducted. A TiAlN film and a RuAlN film are given as examples of the Metal-Al—N film.

As a conventional film-forming method of the metal composite film, an ALD method can be given as a main stream, wherein two precursors and reactive gas are alternately supplied (for example see non-patent documents 1 and 2). The non-patent documents 1 and 2 disclose an example of forming a film by PEALD (Plasma Enhanced ALD) method using plasma.

RELATED TECHNICAL DOCUMENT

Non-Patent Document (Non-Patent Document 1)
Young Ju Lee and Sang-Won Kang: Electrochemical and Solid-State Letters, 6(5) C70-C72 (2003) "Ti—Al—N Thin Films Prepared by the Combination of Metallorganic Plasma-Enhanced Atomic Layer Deposition of Al and TiN"

(Non-patent document 2)
Youn Ju Lee and Sang-Won Kang: J. Vac. Sci. Technol. A, Vol. 21, No. 5, September/October 2003 "Controlling the composition of Ti1-XAlXN thin films by modifying the number of TiN and AlN subcycles in atomic layer deposition"

SUMMARY OF THE INVENTION

However, when the metal composite film is formed by ALD method, there is a problem that residual impurities resulting from the precursor can not be completely removed, due to its low processing temperature. Meanwhile, the metal composite film is also formed by PEALD method using plasma as shown in the non-patent document 1. However, when a film is formed by PEALD method, flatness of the film is sometimes deteriorated, and when this method is applied to formation of the gate electrode, because plasma is used, there is a risk of plasma damage added to a gate insulating film and increase of EOT.

Also, when the metal composite film is formed by ALD method by alternate supply of two kinds of precursors and reactive gas, its film-forming rate is problematic, thus involving a great problem that tremendous time is required and the precursor is wasted.

Therefore, it is desirable to provide a manufacturing method of a semiconductor device and a substrate processing apparatus capable of reducing residual impurities in the film without adding plasma damage thereto, capable of improving flatness of the film, and further capable of improving the film-forming rate while suppressing a use amount of precursor.

According to one aspect of the present invention, there is provided a manufacturing method of a semiconductor device, including the steps of:

forming an insulating film on a substrate;

forming a high dielectric constant insulating film on the insulating film; and forming a titanium aluminum nitride film on the high dielectric constant insulating film, wherein in the step of forming the titanium aluminum nitride film, formation of an aluminum nitride film and formation of a titanium nitride film are alternately performed repeatedly, and at that time, the aluminum nitride film is formed firstly and/or lastly. Here, the high dielectric constant insulating film means the insulating film having a higher dielectric constant than the dielectric constant of $SiO_2$ (about 4). Also, forming the aluminum nitride film firstly and/or lastly means the forming the aluminum nitride film firstly (AlN-first), forming the aluminum nitride film lastly (AlN-last), or the forming the aluminum nitride film firstly and lastly (AlN first and last).

According to another aspect of the present invention, there is provided a manufacturing method of a semiconductor device, including the steps of:

forming an insulating film on a substrate;

forming a high dielectric constant insulating film on the insulating film; and forming a titanium aluminum nitride film on the high dielectric constant insulating film, wherein in the step of forming the titanium aluminum nitride film, formation of an aluminum nitride film by ALD method and formation of a titanium nitride film by CVD method are alternately performed repeatedly, in the same processing chamber, with purge of an inside of the processing chamber sandwiched between them, in a state of setting temperature of the substrate to be the same temperature, and at that time, the aluminum nitride film is formed firstly and/or lastly.

According to further another aspect of the present invention, there is provided a substrate processing apparatus, including:

a processing chamber that processes a substrate on which a high dielectric constant insulating film is formed on the surface through an insulating film;

a first source supply system that supplies a first source containing alminiumaluminum atoms into the processing chamber;

a second source supply system that supplies a second source containing titanium atoms into the processing chamber;

a reactive gas supply system that supplies reactive gas containing nitrogen atoms into the processing chamber;

a heater that heats the substrate in the processing chamber; and a controller that controls the first source supply system, the second source supply system, the reactive gas supply system, and the heater, so that a titanium aluminum nitride film is formed on high dielectric constant insulating film formed on the substrate, by alternately and repeatedly performing formation of an aluminum nitride film by supplying the first source and the reactive gas into the processing chamber and formation of a titanium nitride film by supplying the second source and the reactive gas into the processing chamber, and at that time, the aluminum nitride film is formed firstly and/or lastly.

According to the manufacturing method of a semiconductor device and the substrate processing apparatus of the present invention, residual impurities in a film can be reduced with no plasma damage added thereto, then flatness of the film can be improved, and further a film-forming rate can be improved while suppressing a use amount of a precursor.

BRIEF DESCRIPTION OF THE DRAWINGS

FIG. 6 is a view showing an evaluation result of an example 1, wherein FIG. 6A shows TDMAT supply time dependency of the CVD-TiN film thickness on HfSiON, AlN, $SiO_2$ in CVD-TiN film formation, and FIG. 6B shows ALD cycle number dependency of the ALD-AlN film thickness on HfSiON, TiN, $SiO_2$ in ALD-AlN film formation.

FIG. 7 is a view showing an evaluation result of an example 2, wherein FIG. 7A shows each sectional TEM photograph after ALD-AlN film formation and CVD-TiN film formation are repeatedly performed and laminate films composed of 5-layers, 11-layers, and 21-layers are formed, and FIG. 7B shows each sectional TEM photograph after ALD-AlN film formation and CVD-TiN film formation are repeatedly performed, then laminated films composed of 5-layers, 11-layers, and 21-layers are formed, and $N_2$ annealing is applied thereto at 900° C.

FIG. 8 is a view showing an evaluation result of an example 3, wherein FIG. 8A shows an XPS depth direction profile after a laminate film composed of 11 layers is formed and $N_2$ annealing is applied thereto at 900° C., and FIG. 8B shows the XPS depth direction profile after a laminate film composed of 21 layers is formed and $N_2$ annealing is applied thereto at 900° C.

FIG. 9 is a view showing an evaluation result of an example 4, wherein FIG. 9A is a view showing ALD-AlN cycle number dependency of Al/Ti concentration in the TiAlN film, and FIG. 9B is a view showing Al concentration dependency of resistivity.

FIG. 10 is a view showing an evaluation result of an example 5, wherein FIG. 10A shows an SEM photograph after the TiAlN film is formed by repeating CVD-TiN film formation and ALD-AlN film formation, and $N_2$ annealing is applied thereto at 900° C. and FIG. 10B shows a sectional TEM photograph after the TiAlN film is formed by repeating the CVD-TiN film formation and ALD-AlN film formation, and $N_2$ annealing is applied thereto at 900° C., and FIG. 10C shows an AFM photograph after the TiAlN film is formed by repeating the CVD-TiN film formation and the ALD-AlN film formation and $N_2$ annealing is applied thereto at 900° C.

FIG. 11 is a view showing an evaluation result of an example 6, wherein FIG. 11A shows a gate structure (evaluation sample structure) of p-MOSFET wherein the TiAlN film formed by repeating the CVD-TiN film formation and ALD-AlN film formation is applied to a gate electrode, and FIG. 11B shows a condition and a lamination structure when the TiAlN film is formed by repeating the CVD-TiN film formation and the ALD-AlN film formation, and FIG. 11C is a view showing Al concentration dependency of effective work function in the TiAlN film.

FIG. 12 is a view showing an evaluation result of an example 7, wherein FIG. 12A shows the gate structure (evaluation sample structure) of p-MOSFET wherein the TiAlN film formed by repeating the CVD-TiN film formation and the ALD-AlN film formation is applied to the gate electrode, and FIGS. 7B and 7C show the condition and the lamination structure when the TiAlN film is formed by repeating the CVD-TiN film formation and the ALD-AlN film formation, and FIG. 12D is a view showing Al concentration dependency of the effective work function in the TiAlN film.

FIG. 13 is a view showing an evaluation result of an example 7, wherein FIG. 7A shows the gate structure (evaluation sample structure) of p-MOSFET wherein the TiAlN film formed by repeating the CVD-TiN film formation and the ALD-AlN film formation is applied to the gate electrode, and FIGS. 13B and 13C show the condition and the lamination structure when the TiAlN film is formed by repeating the CVD-TiN film formation and the ALD-AlN film formation, and FIG. 7D is a view showing Al concentration dependency of the effective work function in the TiAlN film.

FIG. 15 is a schematic block diagram of a vertical processing furnace of a vertical ALD apparatus suitably used in this embodiment, wherein FIG. 15A shows a vertical sectional face of a processing furnace part 302, and FIG. 15B shows a sectional view of the processing furnace 302 part taken along the line A-A in the FIG. 15A.

DESCRIPTION OF PREFERRED
EMBODIMENTS OF THE INVENTION (1) Structure of the Substrate Processing Apparatus First, the structure of the substrate processing apparatus according to this embodiment will be described, with reference to FIG. 3 and FIG. 4.

(Processing Chamber)

Figure 3:
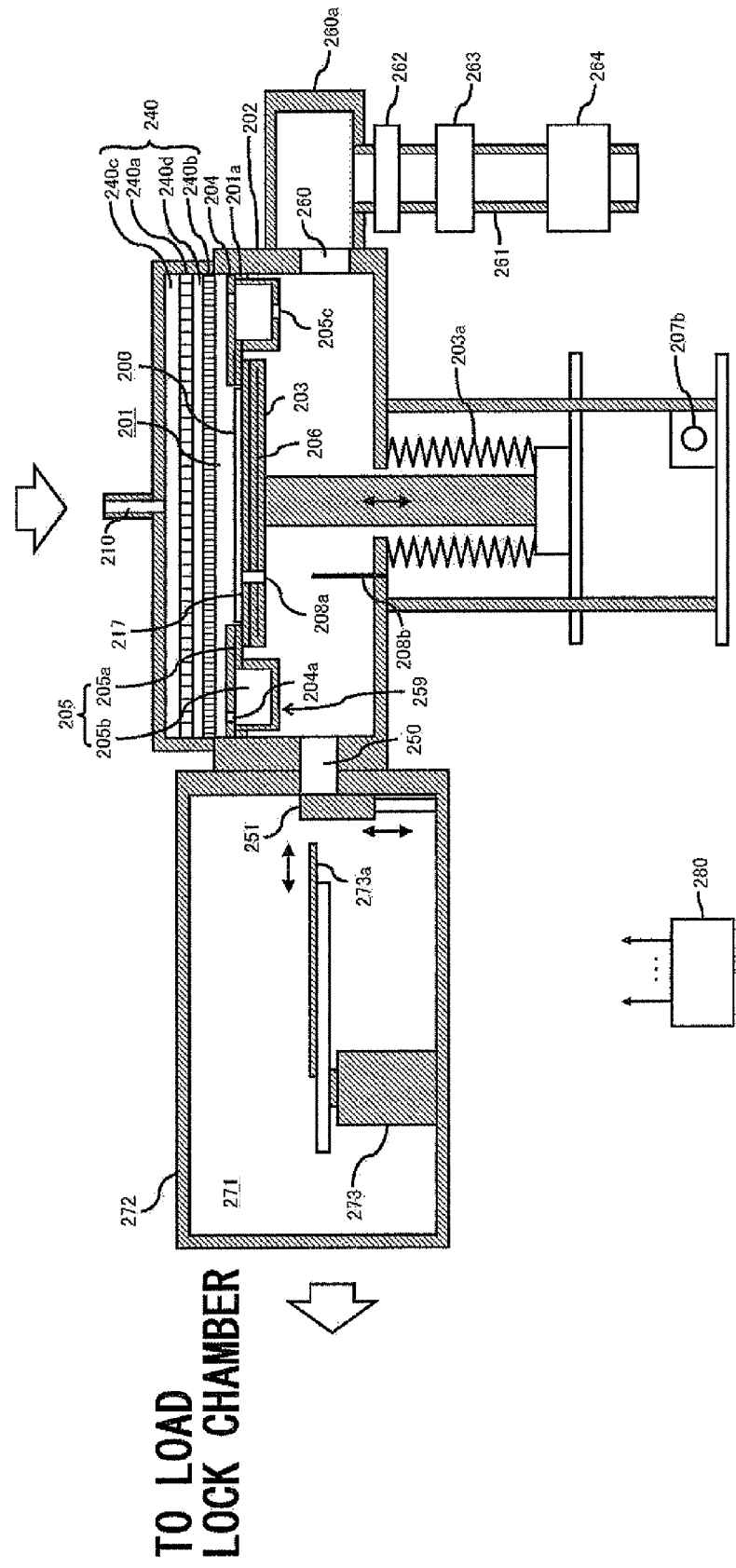
FIG. 3 is a sectional block diagram of the substrate processing apparatus at the time of processing a wafer according to an embodiment of the present invention.
Figure 4:
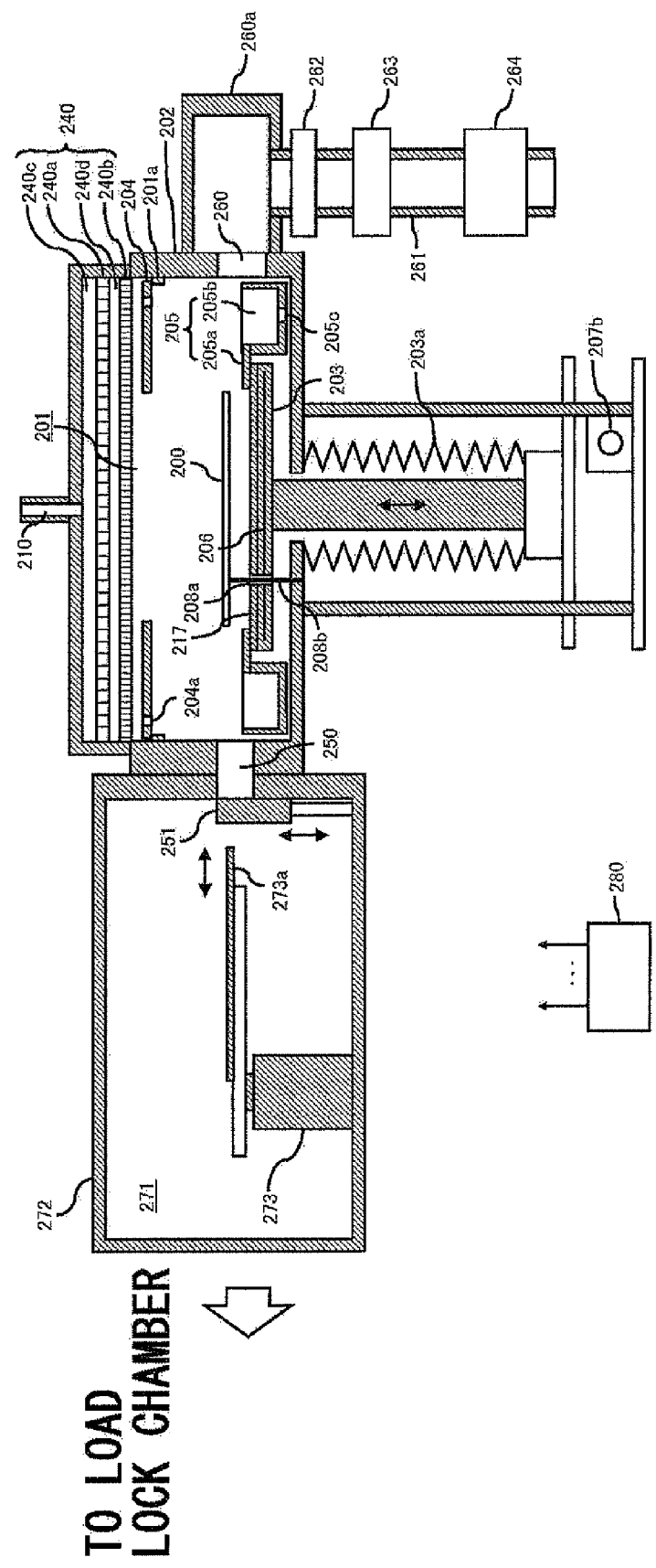
FIG. 4 is a sectional block diagram of the substrate processing apparatus at the time of transferring a wafer according to an embodiment of the present invention.

As shown in FIG. 3 and FIG. 4, the substrate processing apparatus according to this embodiment includes a processing container 202. The processing container 202 is constituted as a flat air-tightly sealed container, with a lateral sectional face formed into a circular shape. Further, the processing container 202 is made of metal materials such as aluminum (Al) and stainless (SUS). A processing chamber 201 for processing a wafer 200 such as silicon wafer as a substrate is formed in the processing container 202.

A support table 203 for supporting the wafer 200 is provided in the processing chamber 201. A susceptor 217, being a support plate made of, for example, quartz ($SiO_2$), carbon, ceramics, and silicon carbide (SiC), aluminum oxide ($Al_2O_3$), or aluminum nitride (AlN) is provided on an upper surface of the support table 203 in direct contact with the wafer 200. Moreover, a heater 206, being a heating unit (heating source) for heating the wafer 200, is built in the support table 203. In addition, a lower end portion of the support table 203 is passed through a bottom part of the processing container 202.

An elevation mechanism 207b for elevating the support table 203 is provided outside of the processing chamber 201. By elevating the support table 203 by actuating this elevation mechanism 207b, the wafer 200 supported on the susceptor 217 can be elevated. The support table 203 is lowered to a position (wafer transfer position) shown in FIG. 4 at the time of transferring the wafer 200, and is elevated to a position (wafer processing position) shown in FIG. 3 at the time of processing the wafer 200. In addition, periphery of the lower end portion of the support table 203 is covered with a bellows 203a, and an inside of the processing chamber 201 is air-tightly maintained.

Further, for example, three lift pins 208b are provided on the bottom surface (floor surface) of the processing chamber 201 in such a manner as being upright in a vertical direction. In addition, on the support table 203 (including susceptor 217), through holes 208a, through which such lift pins 208b are passed through, are provided at positions corresponding to the lift pins 208b respectively. Then, when the support table 203 is lowered to the wafer transfer position, as shown in FIG. 4, upper end portions of the lift pins 208b are protruded from an upper surface of the susceptor 217, thus supporting the wafer 200 from below by the lift pins 208b. Further, when the support table 203 is elevated to the wafer processing position, as shown in FIG. 3, the lift pins 208b are embedded from the upper surface of the susceptor 217, so that the wafer 200 is supported by the susceptor 217 from below. Note that the lift pins 208b are desirably made of, for example, materials such as quartz and alumina, because the lift pins 208b are directly brought into contact with the wafer 200.

(Wafer Transfer Port)

A wafer transfer port 250 for transferring the wafer 200 to inside/outside of the processing chamber 201 is provided on the inner wall side of the processing chamber 201 (processing container 202). A gate valve 251 is provided in the wafer transfer port 250, and by opening the gate valve 251, the inside of the processing chamber 201 and the inside of the transfer chamber (preliminary chamber) 271 are communicated with each other. The transfer chamber 271 is formed in the transfer container (air-tightly sealed container) 272, and a transfer robot 273 for transferring the wafer 200 is provided in the transfer chamber 271. A transfer arm 273a for supporting the wafer 200 at the time of transferring the wafer 200 is provided in the transfer robot 273. By opening the gate valve 251, with the support table 203 lowered to the wafer transfer position, the wafer 200 can be transferred between the inside of the processing chamber 201 and the inside of the transfer chamber 271 by the transfer robot 273. The wafer 200 transferred into the processing chamber 201 is temporarily placed on the lift pins 208b as described above. In addition, a load-lock chamber not shown is provided on the opposite side to the side where the wafer transfer port 250 of the transfer chamber 271 is provided, so that the wafer 200 can be transferred between the inside of the load-lock chamber and the inside of the transfer chamber 271 by the transfer robot 273. Note that the load-lock chamber functions as a preliminary chamber for temporarily housing unprocessed or already processed wafer 200.

(Exhaust System)

An exhaust port 260 for exhausting an atmosphere in the processing chamber 201 is provided on inner wall side of the processing chamber 201 (processing container 202) and on the opposite side of the wafer transfer port 250. An exhaust tube 261 is connected to the exhaust port 260 through an exhaust chamber 260a, and a pressure adjuster 262 such as an APC (Auto Pressure Controller) for controlling a pressure in the processing chamber 201 to be a prescribed pressure, a source recovery trap 263, and a vacuum pump 264 are sequentially connected to the exhaust tube 261 in series. An exhaust system (exhaust line) is mainly constituted of the exhaust port 260, the exhaust chamber 260a, the exhaust tube 261, the pressure adjuster 262, the source recovery trap 263, and the vacuum pump 264.

(Gas Inlet Port)

A gas inlet port 210 for supplying each kind of gas into the processing chamber 201 is provided on an upper surface (ceiling wall) of a shower head 240 as will be described later provided in an upper part of the processing chamber 201. Note that the structure of the gas supply system connected to the gas inlet port 210 will be described later.

(Shower Head)

The shower head 240, being a gas dispersion mechanism, is provided between the gas inlet port 210 and the processing chamber 201. The shower head 240 includes a dispersion plate 240a for dispersing the gas introduced from the gas inlet port 210, and a shower plate 240b for further uniformly dispersing the gas passed through the dispersion plate 240a and supplying the gas to the surface of the wafer 200 on the support table 203. A plurality of ventilation holes are provided on the dispersion plate 240a and the shower plate 240b. The dispersion plate 240a is disposed so as to oppose to an upper surface of the shower head 240 and the shower plate 240b, and the shower plate 240b is disposed so as to oppose to the wafer 200 on the support table 203. In addition, space is provided between the upper surface of the shower head 240 and the dispersion plate 240a, and between the dispersion plate 240a and the shower plate 240b respectively, and such a space functions respectively as a first buffer space (dispersion chamber) 240c for dispersing the gas supplied from the gas inlet port 210, and a second buffer space 240d for dispersing the gas passed through the dispersion plate 240a.

(Exhaust Duct)

A step part 201a is provided on the inner wall side of the processing chamber 201 (processing container 202). Then, this step part 201a is constituted so that a conductance plate 204 is held in the vicinity of the wafer processing position. The conductance plate 204 is constituted as a donut-shaped (ring-shaped) disc, with a hole formed therein for housing the wafer 200 in an inner peripheral part. A plurality of discharge ports 204a arranged in a peripheral direction at prescribed intervals are provided on an outer peripheral part of the conductance plate 204. The discharge port 204a is discontinuously formed, so that the inner peripheral part of the conductance plate 204 can be supported by the outer peripheral part of the conductance plate 204.

Meanwhile, a lower plate 205 is mounted on the outer peripheral part of the support table 203. The lower plate 205 includes a ring-shaped recess part 205b and a flange part 205a integrally provided in the inside upper part of the recess part 205b. The recess part 205b is provided so as to cover the gap between the outer peripheral part of the support table 203 and the inner wall side of the processing chamber 201. A plate exhaust port 205c for discharging (flowing) the gas to the side of the exhaust port 260 from the inside of the recess part 205b, is provided at a part in the vicinity of the exhaust port 260 on the bottom part of the recess part 205b. The flange part 205a functions as an engaging member to be mounted on an upper outer peripheral edge of the support table 203. By making the flange part 205a mounted on the upper outer peripheral edge of the support table 203, the lower plate 205 is elevated and lowered together with the support table 203, in association with an elevation and lowering of the support table 203.

When the support table 203 is elevated to the wafer processing position, the lower plate 205 is also elevated to the wafer processing position. As a result, the upper surface part of the recess part 205b of the lower plate 205 is covered by the conductance plate 204 held in the vicinity of the wafer processing position, thus forming an exhaust duct 259, with inside of the recess part 205b as a gas flow passage area. In addition, at this time, the inside of the processing chamber 201 is partitioned into a processing chamber upper part in an upper part of the exhaust duct 259, and a processing chamber lower part in a lower part of the discharge duct 259, by the exhaust duct 259 (the conductance plate 204 and the lower plate 205) and the support table 203. Note that the conductance plate 204 and the lower plate 205 are preferably made of a material that can be held at a high temperature such as quartz for high temperature resistance and high load resistance, in consideration of a case of etching reaction products deposited on an inner wall of the exhaust duct 250 (case of self-cleaning).

Here, flow of the gas in the processing chamber 201 in the wafer processing will be described. First, the gas supplied to the upper part of the shower head 240 from the gas inlet port 210 enters into the second buffer space 240d from a plurality of holes, through the first buffer space (dispersion chamber) 240c, and further passes through a plurality of holes of the shower plate 240b and supplied into the processing chamber 201, and uniformly supplied onto the wafer 200. Then, the gas supplied onto the wafer 200 radially flows toward outside of the wafer 200 in a diameter direction. Then, excess gas after brought into contact with the wafer 200 radially flows toward the outside of the wafer 200 in the diameter direction, over the exhaust duct 259 positioned on the outer peripheral part of the wafer 200, namely, over the conductance plate 204, and is discharged into a gas flow passage area (into the recess part 205b) in the exhaust duct 259, from the discharge port 204a provided in the conductance plate 204. Thereafter, the gas flows through the exhaust duct 259, and is exhausted to the exhaust port 260 via the plate exhaust port 205c. By flowing the gas this way, a gas flow coming round to the rear side of the support table 203 and the bottom side of the processing chamber 201 is suppressed.

<Gas Supply System>

Figure 2:
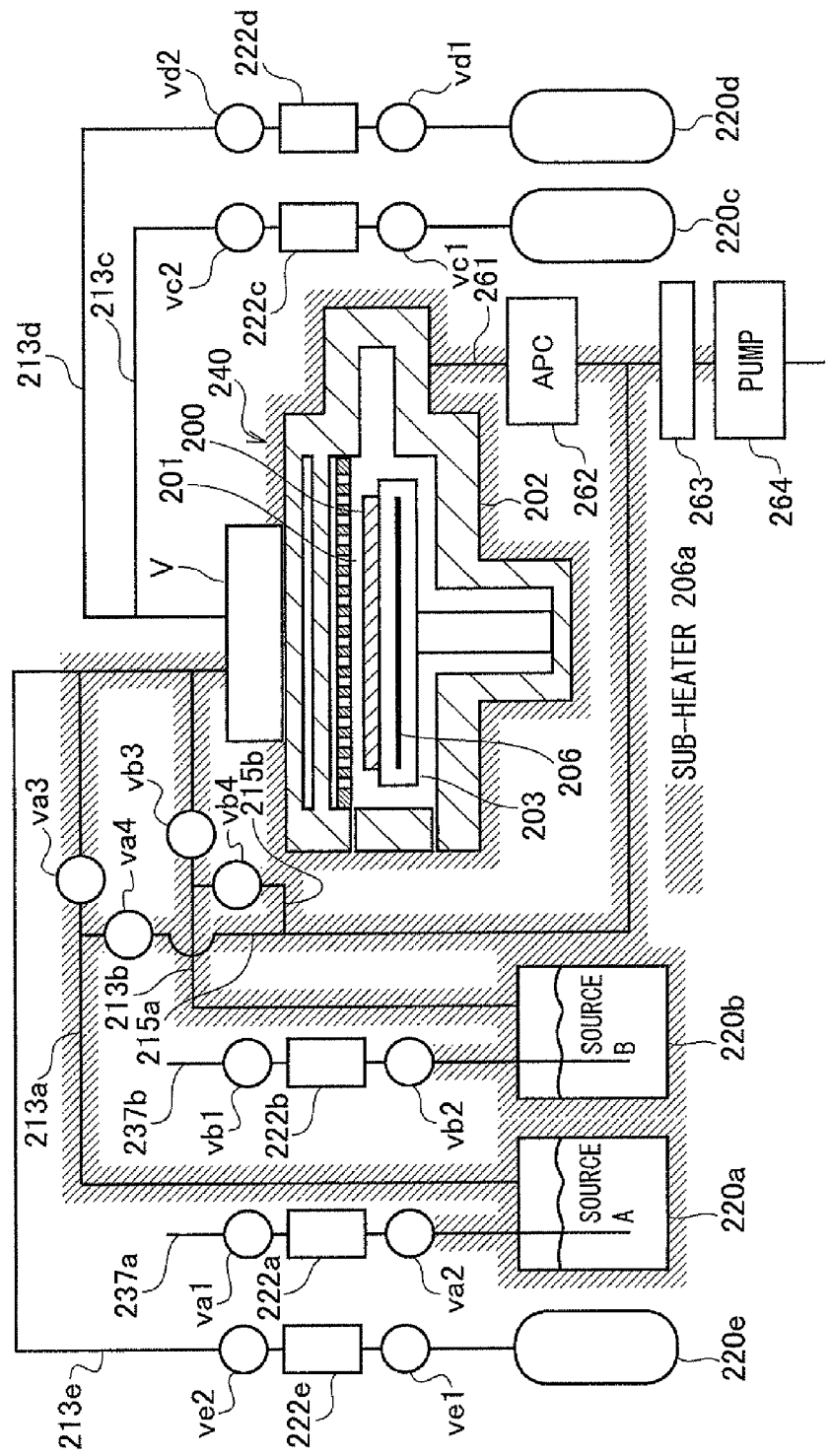
FIG. 2 is a block diagram of a gas supply system possessed by a substrate processing apparatus according to an embodiment of the present invention.

Subsequently, the structure of the gas supply system connected to the aforementioned gas inlet port 210 will be described, with reference to FIG. 2. FIG. 2 is a block diagram of the gas supply system (gas supply line) of the substrate processing apparatus according to this embodiment.

The gas supply system of the substrate processing apparatus according to this embodiment includes a bubbler, being a vaporization part for vaporizing liquid source in a liquid state at a normal temperature, a source gas supply system for supplying source gas obtained by vaporizing the liquid source by the bubbler into the processing chamber 201; and a reactive gas supply system for supplying reactive gas different from the source gas into the processing chamber 201. Further, the substrate processing apparatus according to the embodiment of the present invention includes a purge gas supply system for supplying purge gas into the processing chamber 201; and a vent (bypass) system for exhausting the source gas from the bubbler so as to bypass the processing chamber 201 without supplying this source gas into the processing chamber 201. The structure of each part will be described below.

<Bubbler>

A first source container (first bubbler) 220a for containing a first source (source A), being a liquid source, and a second source container (second bubbler) 220b for supplying a second source (source B), being the liquid source, are provided outside of the processing chamber 201. The first bubbler 220a and the second bubbler 220b are constituted as a tank (airtightly sealed container) capable of containing (filling) inside with the liquid source respectively, and are also constituted as the vaporization part for generating the source gas by vaporizing the liquid source by bubbling. In addition, the first bubbler 220a, the second bubbler 220b, and a sub-heater 206a for heating the liquid source inside are provided around the first bubbler 220a and the second bubbler 220b. As the first source, for example, TDMAT (Tetrakis-Dimethyl-Amido-Titanium), being an organic metal liquid source containing Ti (titanium) element is used, and as the second source, for example, TMA (Trimethylaluminum), being the organic metal liquid source containing Al (aluminum) element is used.

A first carrier gas supply tube 237a and a second carrier gas supply tube 237b are respectively connected to the first bubbler 220a and the second bubbler 220b. A carrier gas supply source not shown is connected to the upstream side end parts of the first carrier gas supply tube 237a and the second carrier gas supply tube 237b. Also, the downstream side end parts of the first carrier gas supply tube 237a and the second carrier gas supply tube 237b are immersed into the liquid source contained in the first bubbler 220a and the second bubbler 220b, respectively. A mass flow controller (MFC) 222a, being a flow rate controller for controlling a supply flow rate of the carrier gas and valves va1 and va2 for controlling supply of the carrier gas, are provided in the first carrier gas supply tube 237a. A mass flow controller (MFC) 222b, being the flow rate controller for controlling the supply flow rate of the carrier gas, and valves vb1 and vb2 for controlling the supply of the carrier gas, are provided in the second carrier gas supply tube 237b. Note that the gas not reactive with the liquid source is preferably used as the carrier gas, and for example, inert gas such as $N_2$ gas and Ar gas is suitably used. The first carrier gas supply system and the second carrier gas supply system (first carrier gas supply line and second carrier gas supply line) are respectively constituted mainly by the first carrier gas supply tube 237a, the second carrier gas supply tube 237b, MFCs 222a and 222b, and valves va1, va1, vb1, and vb2.

With above-described structure, by opening the valves va1, va2, vb1, vb2, and supplying the carrier gas, with flow rate controlled by the MFCs 222a and 222b from the first carrier gas supply tube 237a and the second carrier gas supply tube 237b into the first bubbler 2201 and the second bubbler 220b, the liquid source contained in the first bubbler 220a and the second bubbler 220b is vaporized by bubbling and the source gas can be generated. Note that the supply flow rate of the source gas can be determined from the supply flow rate of the carrier gas. Namely, by controlling the supply flow rate of the carrier gas, the supply flow rate of the source gas can be controlled.

<Source Gas Supply System>

A first source gas supply tube 213a and a second source gas supply tube 213b for supplying the source gas generated in the first bubbler 220a and the second bubbler 220b into the processing chamber 201, are respectively connected to the first bubbler 220a and the second bubbler 220b. The upstream side end parts of the first source gas supply tube 213a and the second source gas supply tube 213b are communicated with a space that exists in upper parts of the first bubbler 220a and the second bubbler 220b. The downstream side end parts of the first source gas supply tube 213a and the second source gas supply tube 213b are merged with each other, which are then connected to the gas inlet port 210 through a highly durable high speed gas valve V. The highly durable high speed gas valve V is a valve constituted so as to speedily switch supply of the gas in a short time so that the gas can be exhausted. In addition, valves va3 and vb3 for controlling the supply of the source gas into the processing chamber 201, are respectively provided in the first source gas supply tube 213a and the second source gas supply tube 213b.

With the above-described structure, the source gas can be generated by vaporizing the liquid source by the first bubbler 220a and the second bubbler 220b, and by opening the valves va3 and vb3, the source gas can be supplied into the processing chamber 201 from the first source gas supply tube 213a and the second source gas supply tube 213b. The first source gas supply system, the second source gas supply system (first source gas supply line and second source gas supply line) are respectively constituted mainly by the first source gas supply tube 213a, the second source gas supply tube 213b, the valves va3 and vb3, and the highly durable high speed gas valve V.

Also, the first source supply system and the second source supply system (first source supply line and second source supply line) are respectively constituted mainly by the first carrier gas supply system, the second carrier gas supply system, the first bubbler 220a, the second bubbler 220b, the first source gas supply system, and the second source gas supply system.

<Reactive Gas Supply System>

Further, a reactive gas supply source 220c for supplying reactive gas is provided outside of the processing chamber 201. The upstream side end part of the reactive gas supply tube 213c is connected to the reactive gas supply source 220c. The downstream side end part of the reactive gas supply tube 213c is connected to the gas inlet port 210 through the highly durable high speed gas valve V. A mass flow controller (MFC) 222c, being the flow rate controller for controlling the supply flow rate of the reactive gas, and valves vc1 and vc2 for controlling the supply of the reactive gas, are provided in the reactive gas supply tube 213c. For example ammonia ($NH_3$) is used as the reactive gas. The reactive gas supply system (reactive gas supply line) is constituted mainly by the reactive gas supply source 220c, the reactive gas supply tube 213c, the MFC 222c, and the valves vc1 and vc2.

<Purge Gas Supply System>

A purge gas supply sources 220d and 220e for supplying purge gas, is provided outside of the processing chamber 201. Upstream side end parts of the purge gas supply sources 220d and 220e are respectively connected to the purge gas supply sources 220d and 220e. Downstream side end parts of the purge gas supply tube 213d are merged with the reactive gas supply tube 213c, and are connected to the gas inlet port 210 through the highly durable high speed gas valve V. Mass flow controllers (MFCs) 222d and 222e, being the flow rate controller for controlling the supply flow rate of the purge gas, and valves vd1, vd2, ve1, and ve2 for controlling the supply of the purge gas are respectively provided in the purge gas supply tubes 213d and 213e. For example, the inert gas such as $N_2$ gas and Ar gas is used as the purge gas. The purge gas supply system (purge gas supply line) is constituted mainly by the purge gas supply sources 220d, 220e, the purge gas supply tubes 213d, 213e, MFCs 222d and 222e, and the valves vd1, vd2, ve1, ve2.

<Vent (Bypass) System>

Further, the upstream side end parts of the first vent tube 215a and the second vent tube 215b are respectively connected to the upstream side of the valves va3 and vb3 of the first source gas supply tube 213a and the second source gas supply tube 213b. Also, the downstream side end parts of the first vent tube 215a and the second vent tube 215b are merged with each other, and are connected to the upstream side of the source recovery trap 263, being the downstream side of the pressure adjuster 262 of the exhaust tube 261. Valves va4 and vb4 for controlling the flow of the gas are respectively provided in the first vent tube 215a and the second vent tube 215b.

With the above-described structure, by closing the valves va3 and vb3, and by opening the valves va4 and vb4, the gas flowing through the first source gas supply tube 213a and the second source gas supply tube 213b can be bypassed the processing chamber 201 through the first vent tube 215a and the second vent tube 215b without being supplied into the processing chamber 201, and can be exhausted respectively to outside of the processing chamber 201 from the exhaust tube 261. A first vent system and a second vent system (first vent line and second vent line) are respectively constituted mainly by the first vent tube 215a, the second vent tube 215b, and the valves va4 and vb4.

As described above, the sub-heater 206a is provided around the first bubbler 220a and the second bubbler 220b. However, other than this case, the sub-heater 206a is also provided around the first carrier gas supply tube 237a, the second carrier gas supply tube 237b, the first source gas supply tube 213a, the second source gas supply tube 213b, the first vent tube 215a, the second vent tube 215b, the exhaust tube 261, the processing container 202, and the shower head 240. The sub-heater 206a is constituted so as to prevent re-liquefication of the source gas inside of these members, by heating these members, for example, at a temperature of 100° C. or less.

<Controller>

In addition, the substrate processing apparatus according to this embodiment has a controller 280 for controlling an operation of each part of the substrate processing apparatus. The controller 280 controls operations of the gate valve 251, the elevation mechanism 207b, the transfer robot 273, the heater 206, the sub-heater 206a, the pressure adjuster (APC) 262, the vacuum pump 264, valves va1 to va4, vab1 to vb4, vc1 to vc2, vd1 to vd2, v31 to ve2, the highly durable high speed gas valve V, the flow rate controllers 222a, 222b, 222c, 222d, and 222e.

(2) Substrate Processing Step

Figure 1:
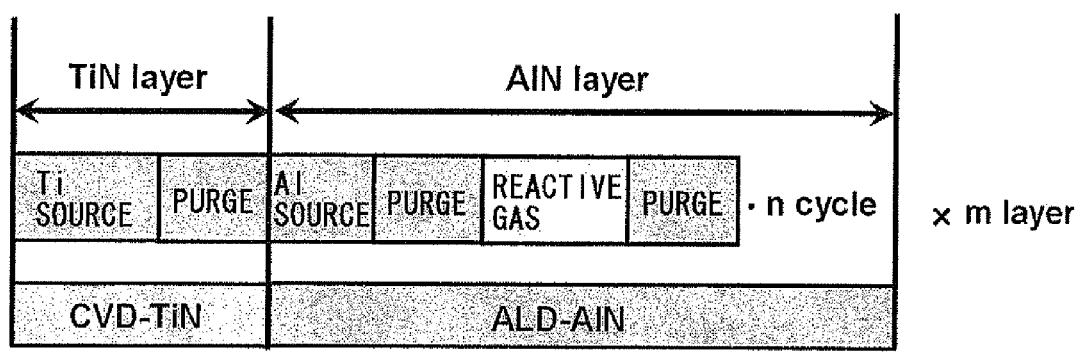
FIG. 1 is a film formation sequence view in the substrate processing step according to an embodiment of the present invention.
Figure 5:
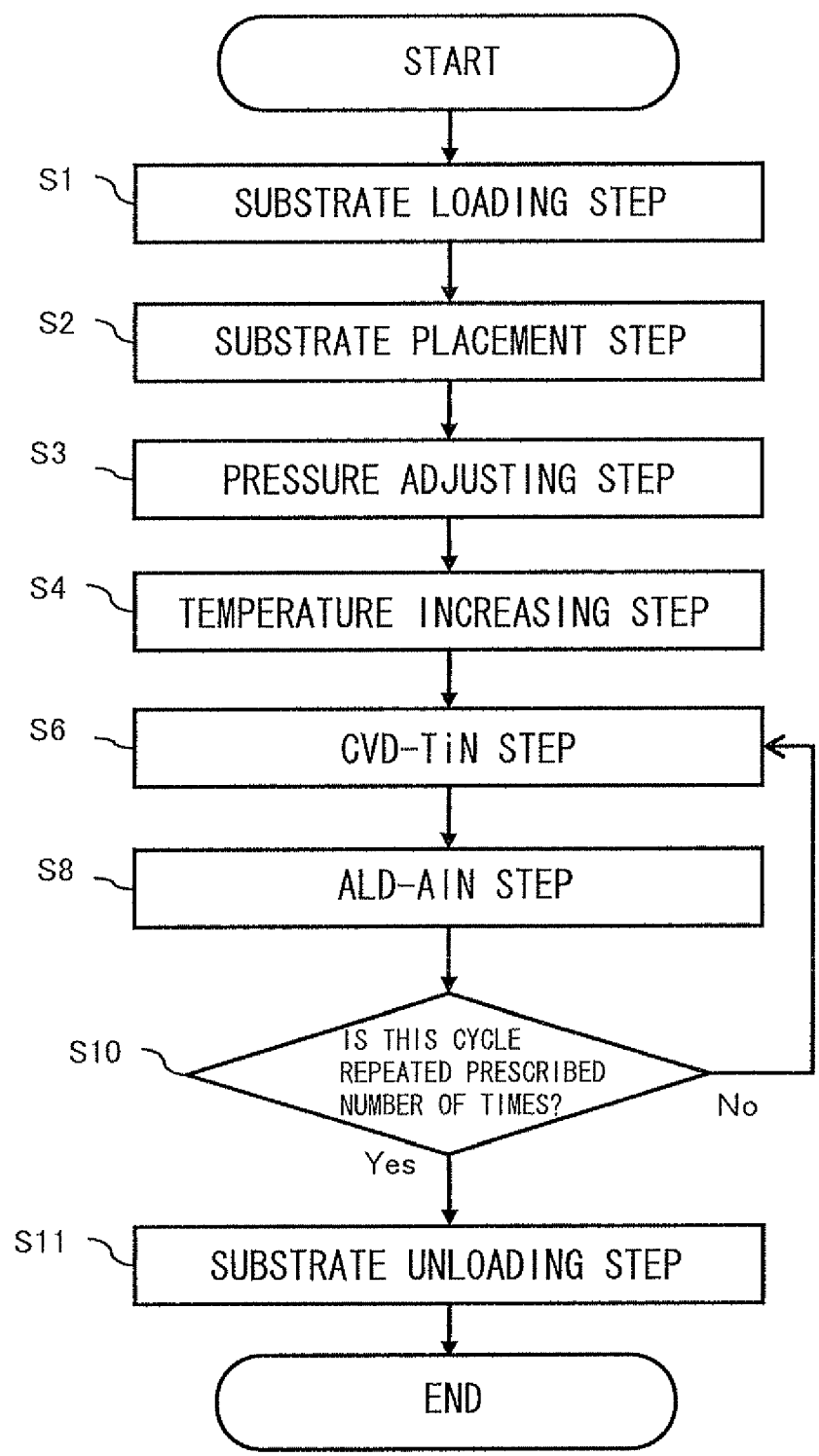
FIG. 5 is a flowchart of the substrate processing steps according to an embodiment of the present invention.

Subsequently, as one step of the manufacturing steps of the semiconductor device according to the embodiment of the present invention, the substrate processing step of forming a thin film on the wafer by combining the CVD method and the ALD method, using the aforementioned substrate processing apparatus, will be described, with reference to FIG. 1 and FIG. 5. FIG. 5 is a flowchart of the substrate processing steps according to the embodiment of the present invention. Also, FIG. 1 is a film formation sequence view of the CVD step and the ALD step in the substrate processing step according to the embodiment of the present invention. Note that in the description hereunder, the operation of each part constituting the substrate processing apparatus is controlled by the controller 280.

Here, explanation will be given for an example of forming a third metal film (TiAlN film) containing a first metal atom (Ti) and a second metal atom (Al), by alternately repeating the CVD step of supplying the first source (TDMAT) containing the first metal atom (Ti) to the substrate and forming on the substrate a first metal film (TiN film) containing the first metal atom (Ti) by CVD method; and the ALD step of forming on the substrate a second metal film (AlN film) containing the second metal atom (Al) by ALD method, with the step of supplying a second source (TMA) containing the second metal atom (Al) to the substrate and the step of supplying the reactive gas (NH$_3$) to the substrate set as one cycle and by performing this cycle for prescribed number of times. Note that in this specification, the term such as "metal film" means a conductive substance containing metal atoms, and conductive metal nitride film, metal oxide film, metal composite film, and metal alloy film, etc, are included therein, other than a film made of metal alone. This will be more specifically described hereinafter.

Substrate Loading Step (S1) and Substrate Placement Step (S2)>

First, the elevation mechanism 207b is operated, and the support table 203 is lowered to the wafer transfer position shown in FIG. 4. Then, the gate valve 251 is opened, so that the processing chamber 201 and the transfer chamber 271 are communicated with each other. Then, the wafer 200, being a processing object, is loaded into the processing chamber 201 from the transfer chamber 271 by the transfer robot 273 in a state of being supported by the transfer arm 273a (S1). The wafer 200 loaded into the processing chamber 201 is temporarily placed on the lift pins 208b protruded from the upper surface of the support table 203. When the transfer arm 273a of the transfer robot 273 is returned to the transfer chamber 271 from the processing chamber 201, the gate valve 251 is closed.

Subsequently, the elevation mechanism 297b is operated and the support table 203 is elevated to the wafer processing position shown in FIG. 3. As a result, the lift pins 208b are buried from the upper surface of the support table 203, and the wafer 200 is placed on the susceptor 217 on the upper surface of the support table 203 (S2).

Pressure Adjusting Step (S3) and Temperature Increasing Step (S4)>

Subsequently, the pressure in the processing chamber 201 is controlled to be a prescribed processing pressure, by the pressure adjuster (APC) 262 (S3). In addition, electric power supplied to the heater 206 is adjusted, so that a surface temperature of the wafer 200 becomes a prescribed processing temperature (S4). Here, the prescribed processing temperature and the processing pressure means the processing temperature and the processing pressure capable of forming the TiN film by CVD method in the CVD-TiN step as will be described later, and also the processing temperature and the processing pressure capable of forming the AlN film by ALD method in the ALD-AlN step as will be described later. Namely, there are provided the processing temperature and the processing pressure such as allowing the first source gas used in the CVD-TiN step to be self-decomposed, and the processing temperature and the processing pressure such as not allowing the second source gas used in the ALD-AlN step to be self-decomposed.

In addition, in the substrate loading step (31), the substrate placement step (32), the pressure adjusting step (S3), and the temperature increasing step (S4), by closing the valves va3, vb3, vc2 and opening the valves vd1, vd2, ve1, ve2, with the vacuum pump 264 operated, N$_2$ gas is flown through the processing chamber 201 on a constant basis. Thus, adhesion of particles onto the wafer 200 can be suppressed.

In parallel to the steps S1 to S4, the first source is vaporized and the first source gas is generated (preliminarily vaporized). Namely, the valves va1 and va2 are opened and the carrier gas, with flow rate controlled by the MFC 222a, is supplied into the first bubbler 220a, to thereby vaporize the first source contained in the first bubbler 220a by bubbling and generate the first source gas in advance (preliminary vaporizing step). In this preliminary vaporizing step, by opening the valve va4, with the valve va3 closed, while operating the vacuum pump 264, the processing chamber 201 is bypassed and exhausted without supplying the first source gas into the processing chamber 201. A prescribed time is required for stably generating the first source gas by the first bubbler. Therefore, in this embodiment, the first source gas is previously generated and by switching the open/close of the valves va3 and va4, the flow passage of the first source gas is switched. As a result, by switching the open/close of the valve, speedy and stable start or stop of the first source gas into the processing chamber 201 is possible, and this is preferable.

<CVD-TiN Step (S6)>
(First Source Gas Supplying Step)

Subsequently, the valve va4 is closed and the valve va3 is opened, while operating the vacuum pump 264, to thereby start the supply of the first source gas (Ti source) into the processing chamber 201. The first source gas is dispersed by the shower head 240 and is uniformly supplied onto the wafer 200 in the processing chamber 201. The excess first source gas is flown through the exhaust duct 259, and is exhausted to the exhaust port 260 and the exhaust tube 261 (first source gas supplying step). At this time, the processing temperature and the processing pressure are set as the processing temperature and the processing pressure such as allowing the first source gas supplied onto the wafer 200 to be self-decomposed. Therefore, CVD reaction occurs due to thermal decomposition of the first source gas supplied onto the wafer 200, and the TiN film is thereby formed on the wafer 200.

In addition, when the first source gas is supplied into the processing chamber 201, preferably the valves vd1 and vd2 stay opened and the N$_2$ gas is always flown through the processing chamber 201, so as to urge dispersion of the first source gas in the processing chamber 201

When a prescribed time is elapsed after the valve va3 is opened and supply of the first source gas is started, and the TiN film with prescribed film thickness is formed, the valve va3 is closed and the valve va4 is opened, to thereby stop the supply of the first source gas into the processing chamber 201. Also, simultaneously the valves va1 and va2 are closed, and the supply of ht carrier gas to the first bubbler 220a is also stopped.

(Purging Step)

After the valve va3 is closed and the supply of the first source gas is stopped, the valves vd1, vd2, ve2, ve2 are opened, to thereby supply the N$_2$ gas into the processing chamber 201. The N$_2$ gas is dispersed by the shower head 240 and is supplied into the processing chamber 201, then flows through the exhaust duct 259, and is exhausted to the exhaust port 260 and the exhaust tube 261. Thus, the first source gas and the reactive by-products remained in the processing chamber 201 are removed, and the inside of the processing chamber 201 is purged by N$_2$ gas (purging step).

In addition, in the CVD-TiN step (S6), the second source is vaporized and the second source gas is generated (preliminarily vaporized), to prepare for the next ALD-AlN step (S8). Namely, the valves vb1 and vb2 are opened and the carrier gas, with flow rate controlled by the MFC 222b, is supplied into the second bubbler 220b from the second carrier gas supply tube 237b, to thereby vaporize the second source contained in the second bubbler 220b by bubbling and previously generate the second source gas (preliminary vaporizing step). In this preliminary vaporizing step, by opening the valve vb4, with the valve vb3 closed, while operating the vacuum pump 264, the processing chamber 201 is bypassed and exhausted without supplying the second source gas into the processing chamber 201. Prescribed time is required for stably generating the second source gas by the second bubbler. Therefore, in this embodiment, by previously generating the second source gas and switching open/close of the valves vb3 and vb4, the flow passage of the second source gas is switched. As a result, stable and speedy start or stop of the supply of the second source gas into the processing chamber 201 is possible, and this is preferable.

<ALD-AlN Step (S8)>
(Second Source Gas Supplying Step)

Subsequently, the valve vb4 is closed and the valve vb3 is opened, while operating the vacuum pump 264, and supply of the second source gas (Al source) into the processing chamber 201 is started. The second source gas is dispersed by the shower head 240 and is uniformly supplied onto the wafer 200 in the processing chamber 201. The excess second source gas is flown through the exhaust duct 259, and is exhausted to the exhaust port 260 and the exhaust tube 261 (second source gas supplying step). Note that at this time, the processing temperature and the processing pressure are set as the processing temperature and the processing pressure such as not allowing the second source gas to be self-decomposed. Therefore, the second source gas supplied onto the wafer 200 is adsorbed on the surface of the wafer 200. More accurately, gas molecules of the second source gas are adsorbed on the TiN film formed on the wafer 200 in the aforementioned CVD-TiN step (S6).

In addition, when the second source gas is supplied into the processing chamber 201, preferably the valves vd1 and vd2 stay opened and the $N_2$ gas is flown through the processing chamber 201 on a constant basis, so as to prevent invasion of the second source gas into the reactive gas supply tube 213c, and so as to urge the dispersion of the second source gas in the processing chamber 201.

When a prescribed time is elapsed after the valve vb3 is opened and supply of the second source gas is started, the valve vb3 is closed and the valve vb4 is opened, to thereby stop the supply of the second source gas into the processing chamber 201.

(Purging Step)

After the valve vb3 is closed to stop the supply of the second source gas, the valves vd1, vd2, ve1, ve2 are opened, to thereby supply the $N_2$ gas into the processing chamber 201. The $N_2$ gas is dispersed by the shower head 240, and is supplied into the processing chamber 201, then flows through the exhaust duct 259, and is exhausted to the exhaust port 260 and the exhaust tube 261. Thus, the second source gas remained in the processing chamber 201 is removed and the inside of the processing chamber 201 is purged by the $N_2$ gas (purging step).

(Reactive Gas Supplying Step)

When purge in the processing chamber 201 is completed, the valves vc1 and vc2 are opened, to thereby start the supply of the reactive gas ($NH_3$ gas) into the processing chamber 201. The reactive gas is dispersed by the shower head 240 and is uniformly supplied onto the wafer 200 in the processing chamber 201, reacted with the second source gas adsorbed on the surface of the wafer 200, to thereby generate the AlN film on the wafer 200. More accurately, the reactive gas reacts with the gas molecules of the second source gas adsorbed on the TiN film formed on the wafer 200 in the aforementioned CVD-TiN step (S6), to thereby generate the AlN film of about less than one atomic layer (less than 1 Å) on the TiN film. The excess reactive gas and the by-product are flown through the exhaust duct 259, and are exhausted to the exhaust port 260 and the exhaust tube 261 (reactive gas supplying step). In addition, when the reactive gas is supplied into the processing chamber 201, preferably the valves ve1 and ve2 stay opened, and the $N_2$ gas is flown through the processing chamber 201 on a constant basis, so as to prevent invasion of the reactive gas into the first source gas supply tube 213a and the second source gas supply tube 213b, and so as to urge dispersion of the reactive gas in the processing chamber 201.

When a prescribed time is elapsed after the valves vc1 and vc2 are opened and supply of the reactive gas is started, the valves vc1 and vc2 are closed and the supply of the reactive gas into the processing chamber 201 is stopped.

(Purging Step)

After the valves vc1 and vc2 are closed and the supply of the reactive gas is stopped, the valves vd1, vd2, ve1, ve2 are opened and the $N_2$ gas is supplied into the processing chamber 201. The $N_2$ gas is dispersed by the shower head 240 and is supplied into the processing chamber 201, then is flown through the exhaust duct 259, and is exhausted to the exhaust port 260 and the exhaust tube 261. Thus, the reactive gas and the reaction by-product remained in the processing chamber 201 are removed, and the inside of the processing chamber 201 is purged by the $N_2$ gas (purging step).

(Cycle Processing)

By performing the cycle processing of executing the ALD cycle for prescribed number of times (n-cycles), with the aforementioned second source gas supplying step, purging step, reactive gas supplying step, and purging step set as one cycle, the AlN film of desired film thickness is formed on the TiN film formed on the wafer 200 in the aforementioned CVD-TiN step. In addition, after the ALD-AlN step (S8) is ended, the valves vb1, vb2 are closed and the supply of the carrier gas to the second bubbler 220b is stopped.

Note that in the ALD-AlN step (S8), the first source is vaporized and the first source gas is previously generated (preliminarily vaporized), to prepare for the next CVD-TiN step (S6). Namely, the valves va1 and va2 are opened, and the carrier gas, with flow rate controlled by the MFC 222a, is supplied into the first bubbler 220a from the first carrier gas supply tube 237a, to thereby vaporize the first source contained in the first bubbler 220a by bubbling and preliminarily generate the first source gas (preliminary vaporizing step). In this preliminary vaporizing step, the processing chamber 201 is bypassed and exhausted by opening the valve va4, with the valve va3 closed, while operating the vacuum pump 264, without supplying the first source gas into the processing chamber 201.

<Repeating Step (S10)>

By repeating the aforementioned CVD-TiN step (S6) and the ALD-AlN step (S8) alternately for prescribed number of times (m-times), the titanium nitride film (CVD-TiN film) by CVD and the aluminum nitride film (ALD-AlN film) by ALD are alternately laminated on the wafer 200, to thereby form titanium aluminum nitride film (TiAlN film), being a metal composite film of a desired film thickness.

<Substrate Unloading Step (S11)>

Thereafter, by the reversed procedure to the procedure shown in the aforementioned substrate loading step (S1) and the substrate placement step (S2), the wafer 200, with the TiAlN film of desired film thickness formed thereon, is unloaded from the processing chamber 201 into the transfer chamber 271, and the substrate processing step according to this embodiment is completed.

Processing conditions of the wafer 200 in the CVD-TiN step (S6) according to this embodiment are given such as: processing temperature: 250 to 450° C., preferably 350 to 450° C.,
processing pressure: 30 to 266 Pa, preferably 30 to 100 Pa, first source (TDMAT) supply flow rate: 10 to 100 sccm, and film thickness (TIN): 1 to 5 nm.

Processing conditions of the wafer 200 in the ALD-AlN step (S8) according to this embodiment are given such as: processing temperature: 250 to 450° C., preferably 350 to 450° C.,
processing pressure: 30 to 266 Pa, preferably 30 to 100 Pa, second source (TMA) supply flow rate: 10 to 100 sccm, reactive gas ($NH_3$) supply flow rate: 50 to 500 sccm, film thickness (AlN): 1 to 5 nm, Further, 10 to 30 nm are exemplified as a total film thickness formed in the repeating step (S10), namely, the film thickness of the TiAlN film.

Note that when the processing temperature is set to be less than 250° C., film-forming reaction by CVD is not generated in the CVD-TiN step (S6). Also, when the processing temperature exceeds 450° C., rising of a film formation rate is explosive, thus making it difficult to control the film thickness. Therefore, in the CVD-TiN step (S6), the processing temperature needs to be set to be 250° C. or more and 450° C. or less, so that the film-forming reaction by CVD is generated, and the film thickness can be controlled. In addition, when the processing temperature is set to be 350° C. or more, impurities in the film is lessened, thus making resistivity low, and this is preferable.

In addition, in this embodiment, preferably the CVD-TiN step (S6) and the ALD-AlN step (S8) are performed at the same processing temperature and/or under the same processing pressure. Namely, in this embodiment, preferably the CVD-TiN step (S6) and the ALD-AlN step (S8) are performed at a constant processing temperature and/or under a constant processing pressure. When the processing temperature and the processing pressure are set to be prescribed values within the aforementioned exemplified range, the film formation by CVD and the film formation by ALD can be realized under the same condition. In this case, a processing temperature changing step and a processing pressure changing step can be eliminated when the CVD-TiN step (S6) is advanced to the ALD-AlN step (38), and when the ALD-AlN step (S8) is advanced to the CVD-TiN step (S6), thus making it possible to improve throughput.

(3) Advantage According to the Embodiment

According to this embodiment, the first metal film (TiN film), becoming a base of the metal composite film (TiAlN film) is formed by CVD method. Therefore, a total film formation rate of the metal composite film can be more improved than that of a case when the film formation is performed only by ALD method, thus making it possible to improve the throughput. In addition, according to this embodiment, when the second metal film (AlN film) is formed by ALD method, it is formed, with the first metal film (TiN film) as a base, thus urging adsorption of the source on the baser and the film formation rate can be more improved than that of a case when the film formation is performed, with an insulating film (Hf-SiON, $SiO_2$) as a base, and the throughput can be improved. Note that in a case of being used for a gate electrode, for the reason described later, it may be preferable that the film formed firstly and/or lastly is the AlN film.

Further, according to this embodiment, by changing the ALD cycle of the second metal film (AlN film) by ALD method, metal composition in the metal composite film (TiAlN film) can be controlled. For example, by changing the number of ALD cycles of the second metal film (AlN film) by ALD method, with the film thickness of the first metal film (TiN film) by CVD method fixed, the composition, namely, the concentration of the second metal atoms (Al) in the metal composite film can be controlled. Also, by changing the number of ALD cycles of the second metal film (AlN film) by ALD method, a composition profile in a depth direction in the metal composite film can be changed.

Further, according to this embodiment, formation of the first metal film (TiN film) by CVD method and formation of the second metal film (AlN film) by ALD method are not simultaneously performed, but performed separately. Moreover, in the CVD-TiN step (S6), the purging step is performed after the first source gas supplying step, to thereby surely perform gas replacement in the processing chamber 201. Further, in the ALD-AlN step (S8) also, purging is performed lastly in a cycle process, and the gas in the processing chamber 201 is surely replaced. Thus, the first source gas and the second source gas are not mixed with each other in the processing chamber 201, and it is possible to suppress the generation of particles due to vapor phase reaction between the first source gas and the second source gas in the processing chamber 201, and improve uniformity in film thickness and composition of the metal composite film (TiAlN film). Note the if the formation of the first metal film (TiN film) by CVD method and the formation of the second metal film (AlN film) by ALD method are simultaneously performed, mixing time and reaction of the first source gas and the second source gas need to be considered, thus making it difficult to control the film thickness and the composition. Further, particles are generated due to vapor phase reaction between the first source gas and the second source gas, resulting in deterioration in the film thickness and the composition of the metal composite film (TiAlN film) in some cases, depending on the combination of gas species.

Also, according to this embodiment, a relatively high temperature process is used in forming the first metal film (TIN film) by CVD method. Therefore, an ALD precursor having relatively high decomposition temperature is selected in forming the second metal film (AlN film). Namely, CVD/ALD is executed at high temperature, and therefore residual impurities in the film can be lessened by heat, without using a damage source such as plasma (non-plasma).

Further, according to this embodiment, use amount of the precursor can be lessened, compared with that of a related art wherein film formation is performed only by ALD method, and therefore it is advantageous in terms of cost.

Other Embodiment of the Present Invention

The aforementioned embodiment describes an example of vaporizing the liquid source contained inside of the bubbler by bubbling. However, the liquid source may be vaporized by using a vaporizer instead of the bubbler.

Also, the aforementioned embodiment describes an example of using TDMAT as Ti source in the CVD-TiN step. However, Ti source such as $TiCl_4$ may also be used, instead of TDMAT. Moreover, the aforementioned embodiment describes an example of supplying the Ti source alone to the wafer in the CVD-TiN step. However, the reactive gas such as $NH_3$ and $H_2$ may be simultaneously supplied.

In addition, the aforementioned embodiment describes an example of using TMA as Al source in the ALD-AlN step. However, the Al source such as $AlCl_3$ may also be used instead of TMA. In addition, the aforementioned embodiment describes an example of using NH$_3$ as the reactive gas in the ALD-AlN step. However, the gas such as H$_2$ may also be used instead of NH$_3$. In addition, in the ALD-AlN step, the number of ALD cycles may be changed. By changing the number of ALD cycles, the composition and the concentration of Al in the metal composite film can be controlled. Moreover, in the ALD-AlN step, the number of ALD cycles may be changed every time the CVD-TiN step and the ALD-AlN step are repeated. Thus, by changing the number of ALD cycles, Al composition profile in a depth direction in the metal composite film can be controlled.

Further, the aforementioned embodiment describes a case of forming the TiAlN film. However, the present invention is not limited thereto, and can be applied to forming films such as RuAlN, TaAlN, MoAlN, NiAlN, CoAlN.

EXAMPLES

Example 1

Figure 6:
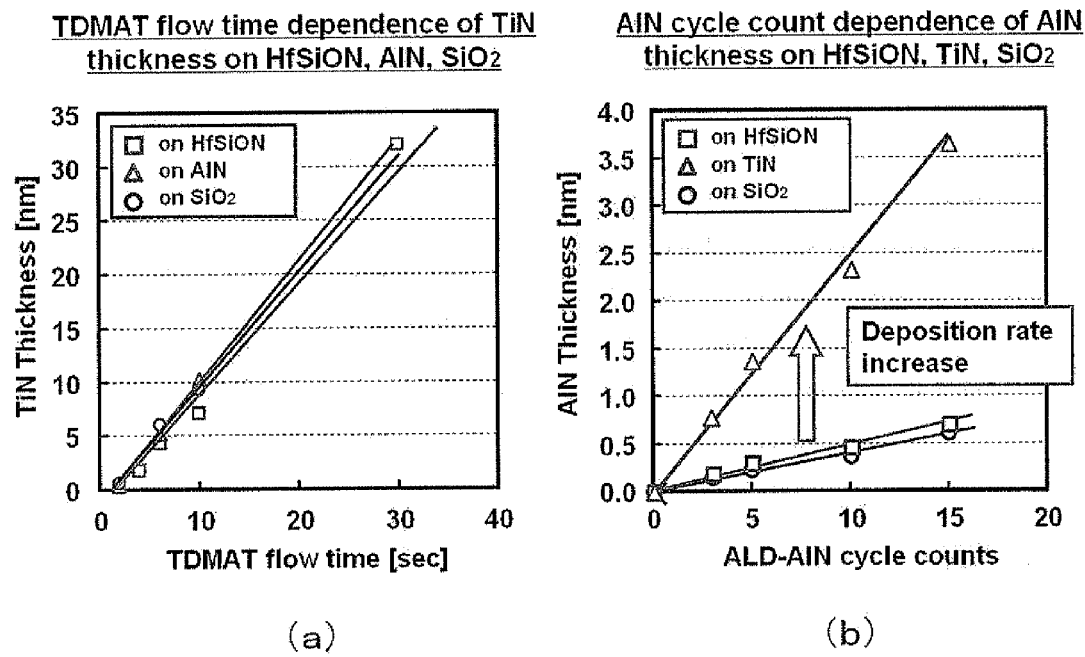

As an example 1 of the present invention, evaluation of the film formation rate of the CVD-TiN film formation and the ALD-AlN film formation will be described. FIG. 6A is a view showing TDMAT supply time dependency of the CVD-TiN film thickness on the HfSiON, AlN, SiO$_2$ in the CVD-TiN film formation. FIG. 6A shows the TDMAT supply time taken on the horizontal axis and the TiN film thickness taken on the vertical axis. FIG. 5B is a view showing the ALD cycle number dependency of the ALD-AlN film thickness on the HfSiON, TiN, SiO$_2$ in the ALD-AlN film formation. FIG. 6B shows the number of cycles of ALD-AlN taken on the horizontal axis, and the AlN film thickness taken on the vertical axis. Note that the CVD-TiN film formation and the ALD-AlN film formation in this evaluation are performed, with the processing conditions set in the values within the processing conditions in the aforementioned embodiments.

It is found from FIG. 6A, that almost no change occurs in the film formation rate on the HfSiON, AlN, and SiO$_2$, in a case of the CVD-TiN film formation. Namely, it is found that the film formation rate hardly depends on the base film in the CVD-TiN film formation. Meanwhile, it is found from FIG. 6B, that in a case of the ALD-AlN film formation, the film formation rate on TiN is tremendously increased, compared with a relatively low film formation rate on HfSiON and SiO$_2$, being insulating films. Namely, it is found that the film formation rate in the ALD-AlN film formation largely depends on the base film. This is because an adsorption amount of the precursor is changed in an area (ultra-thin film area) where the film thickness is extremely thin. It is found from FIG. 6B, that the film formation rate can be tremendously increased, by performing ALD-AlN film formation, with TiN set as a base.

In a case of being applied to the gate electrode, AlN is preferably set as the film formed firstly as will be described later (first layer). In this case, since the base of the first layer is not TiN, the aforementioned advantage cannot be obtained. However, the ALD-AlN film formation is performed thereafter, with TiN set as a base, and therefore in this case also, the film formation rate can be tremendously increased.

Example 2

Figure 7:
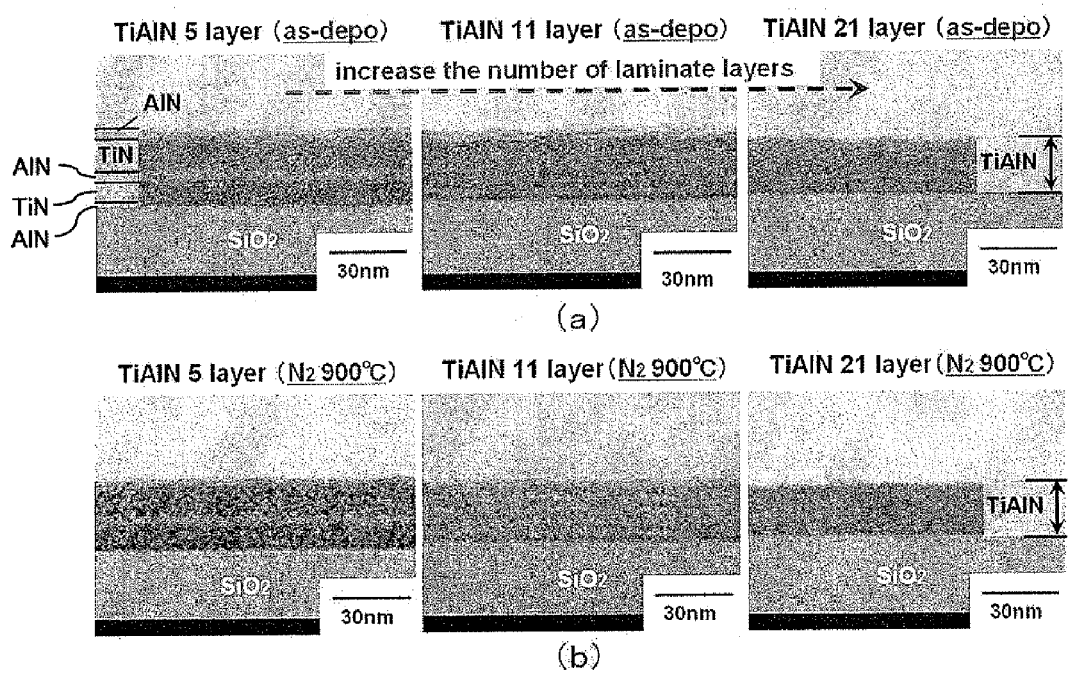

As an example 2 of the present invention, explanation will be given for a film formation evaluation (analysis by sectional TEM photograph) of a laminate film, by repeating the CVD-TiN film formation and the ALD-AlN film formation. FIG. 7A shows the sectional TEM photograph after repeating the ALD-AlN film formation and the CVD-TiN film formation and forming the laminate film composed of 5-layers (TiAlN of 5-layers), laminate film composed of 11-layers (TiAlN of 11-layers), and laminate film composed of 21-layers (TiAlN of 21-layers) respectively. Also, FIG. 7B shows the sectional TEM photograph after repeating the ALD-AlN film formation and the CVD-TiN film formation and forming the laminate film composed of 5-layers (TiAlN of 5-layers), laminate film composed of 11-layers (TiAlN of 11-layers), and laminate film composed of 21-layers (TiAlN of 21-layers) respectively, with N$_2$ annealing applied thereto at 900° C. Note that either of the CVD-TiN film formation and the ALD-AlN film formation in this evaluation is performed, with the processing conditions set in the values within the range of the processing conditions in the aforementioned embodiment. Further, in each case, the AlN layer is formed firstly and lastly, when the laminated film is formed. Namely, a lowermost layer and an uppermost layer of the laminate layer are set as the AlN layer. Also, a target film thickness of the laminate film is set to be about 20 nm to 22 nm.

It is found from FIG. 7A and FIG. 7B, that a boundary between the TiN layer and the AlN layer is ambiguous, irrespective of presence/absence of execution of N$_2$ annealing, in the laminate film composed of 11-layers (TiAlN of 11-layers) and the laminate film composed of 21-layers (TiAlN of 21-layers). In the laminate film composed of 21-layers (TiAlN of 21-layers), the boundary between the TiN layer and the AlN layer can hardly be discriminated irrespective of the presence/absence of N2 annealing, and it can be said that the laminate film composed of 21-layers is visually equivalent to the TiAlN film of one layer. Namely, even when the film of the same thickness is formed, the boundary between the TiN layer and the AlN layer is ambiguous (each layer is mixed with one another), as the number of layers of the laminate film is increased, and this laminate film becomes close to the TiAlN film of one layer. In addition, when a case of applying N$_2$ annealing and a case of not applying N$_2$ annealing are compared, it can be confirmed that there is almost no difference in the laminate film visually, and in each case, no film peeling occurs.

Example 3

Figure 8:
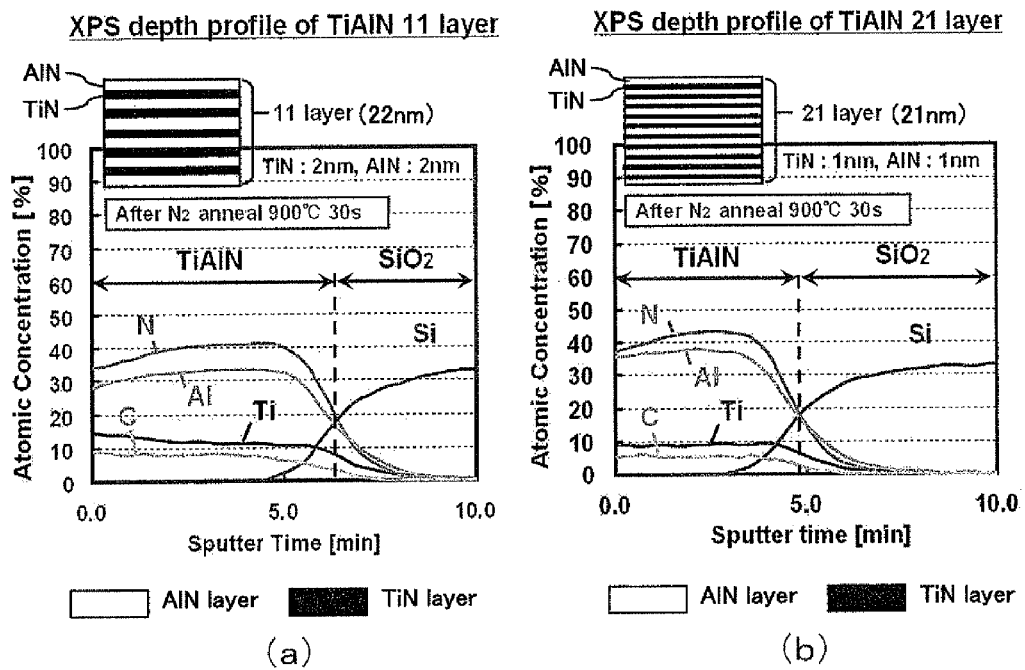

As an example 3 of the present invention, explanation will be given for a film formation evaluation (profile analysis in XPS depth direction) of the laminate film by repeating the CVD-TiN film formation and the ALD-AlN film formation. FIG. 8A is a view showing a profile in the XPS depth direction after the laminate film composed of 11-layers (22 nm) (TiAlN of 11-layers) is formed (TiN: 2 nm, AlN: 2 nm) and N$_2$ annealing is applied thereto at 900° C., and FIG. 8B is a view showing the profile in the XPS depth direction after the laminate film composed of 21-layers (21 m) (TiAlN of 21-layers) is formed (TiN: 1 nm, AlN: 1 nm) and annealing is applied thereto at 900° C. Each view shows a sputtering time (same as the depth direction) taken on the horizontal axis, and the concentration of each atom in the film taken on the vertical axis. Note that the CVD-TiN film formation and the ALD-AlN film formation in this evaluation was performed, with the processing conditions set to be the values within the range of the processing conditions in the aforementioned embodiment. In addition, in each case, the AlN layer was firstly and lastly formed, when the laminated film was formed. Namely, the lowermost layer and the uppermost layer of the laminate film were set as the AlN layers.

In FIG. 8A and FIG. 8B, it is found from the analysis of the profile in the XPS depth direction, that carbon (C) concentration in the TiAlN film is lower than 10 atom % when the laminate film composed of 11-layers (TiAlN of 11-layers) is formed and $N_2$ annealing is applied thereto at 900° C., and is lower than 5 atom % when the laminate film composed of 21-layers (TiAlN of 21-layers) is formed and $N_2$ annealing is applied thereto at 900° C.

Example 4

Figure 9:
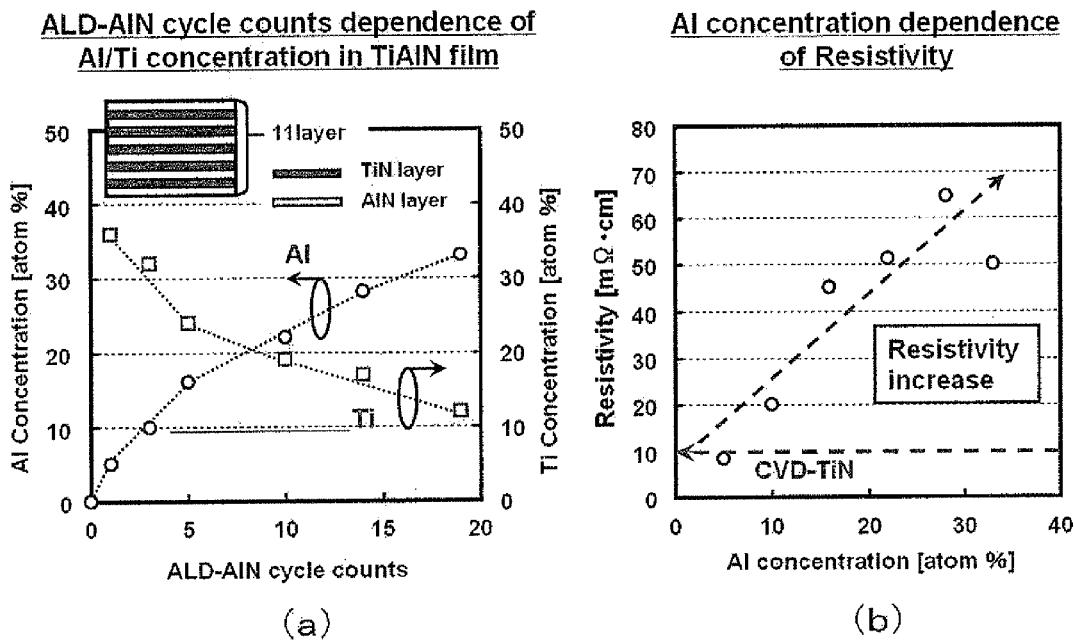

As an example 4 of the present invention, explanation will be given for a film formation evaluation (analysis of Al concentration control and resistivity in TiAlN film) of the laminate film by repeating the CVD-TiN film formation and the ALD-AlN film formation. FIG. 9A is a view showing ALD-AlN cycle number dependency of Al/Ti concentration in the TiAlN film composed of the laminate film of 11-layers. FIG. 9A shows the number of ALD-AlN cycles taken on the horizontal axis, Al concentration taken on the vertical axis on the left side, and Ti concentration taken on the vertical axis on the right side. FIG. 9B is a view showing Al concentration dependency of resistivity. FIG. 9B shows the Al concentration taken on the horizontal axis, and the resistivity taken on the vertical axis. Note that the CVD-TiN film formation and the ALD-AlN film formation in this evaluation were both performed, with the processing conditions set to be the values within the processing conditions in the aforementioned embodiment. Further, in each case, the AlN layer was formed firstly and lastly when the laminate film was formed. Namely, the lowermost layer and the uppermost layer of the laminate film were set as AlN layers. In addition, the film thickness of TiN was fixed to 2 nm, and the film thickness of AlN was changed by changing the number of ALD-AlN cycles.

It is found from FIG. 9A, that the Al concentration in the TiAlN film can be controlled to about 35 atom %, by changing the number of ALD-AlN cycles. Also, it is found from FIG. 9B, that the resistivity of the TiAlN film is likely to be increased, as the Al concentration is increased.

Example 5

As an example 5 of the present invention, the film formation evaluation of the laminate film (TEM/SEM/AFM analysis) by repeating the CVD-TiN film formation and the ALD-AlN film formation will be described. FIG. 10A shows an SEM photograph after forming the TiAlN film by repeating the CVD-TiN film formation and the ALD-AlN film formation, and applying $N_2$ annealing thereto at 900° C. FIG. 10B shows a sectional TEM photograph after forming the TiAlN film by repeating the CVD-TiN film formation and the ALD-AlN film formation and applying $N_2$ annealing thereto at 900° C. FIG. 10C shows an AFM photograph after forming the TiAlN film by repeating the CVD-TiN film formation and the ALD-AlN film formation and applying $N_2$ annealing thereto at 900° C. In any one of these cases, the TiAlN film was constituted by the laminate film of 21-layers (21 nm) (TiN: 1 nm, AlN: 1 nm). In addition, the CVD-TiN film formation and the ALD-AlN film formation in this evaluation were performed, with the processing conditions set in the values within the range of the processing conditions in the aforementioned embodiment. Further, in any one of these cases, when the laminate film was formed, the AlN layer was formed firstly and lastly. Namely, the lowermost layer and the uppermost layer of the laminate film were set as the AlN layers.

It is found from FIG. 10A, FIG. 10B, and FIG. 10C, that no condensation of grains and no peel-off of the film occur. Also, it is found that the surface of these films is relatively smooth (RMS=1.0 nm).

Example 6

As an example 6 of the present invention, evaluation of pMOS application wherein the TiAlN film formed by repeating the CVD-TiN film formation and the ALD-AlN film formation is applied to the gate electrode of pMOS, will be described. FIG. 11A shows an evaluation sample structure, and shows a gate structure of p-MOSFET wherein the TiAlN film formed by repeating the CVD-TiN film formation and the ALD-AlN film formation is applied to the gate electrode. Specifically, FIG. 11A shows a structure in which SiON film is formed on a silicon wafer as an interface layer, and HfSiON film is formed thereon as a high dielectric constant gate insulating film, and TiAlN film and further W film are formed thereon as the metal gate electrode by the aforementioned method (W/TiAlN/Hf(Al)SiON/SiON/Si wafer). Note that Hf(Al)SiON in the figure shows that Al in the TiAlN film is mixed into the HfSiON film due to this structure. Also, as the interface layer, $SiO_2$ film may be used instead of the SiON film. FIG. 11B shows the conditions for forming ALD-TIAlN, namely, the TiAlN film by repeating the CVD-TiN film formation and the ALD-AlN film formation, and its laminate structure. FIG. 11C is a view showing Al concentration dependency of the effective work function in the TiAlN film. FIG. 11C shows the Al concentration in TiAlN taken on the horizontal axis, the effective work function taken on the vertical axis on the left side, and EOT taken on the vertical axis on the right side. Symbol ○ and symbol □ in the figure show the effective work function and the EOT, respectively. In addition, in this evaluation, three kinds of samples, with Al concentration changed like 10%, 20%, 30% in the TiAlN film, were prepared. The CVD-TiN film formation and the ALD-AlN film formation in this evaluation were both performed, with the processing conditions in the aforementioned embodiment set in the values within the processing conditions in the aforementioned embodiment. In addition, the TiAlN film is constituted by the laminate film of 21-layers, and in each case, the AlN layers were formed firstly and lastly when the laminate film was formed. Namely, the uppermost layer and the lowermost layer of the laminate film were set as the AlN layers. Further, the effective work function shows data after active annealing (Spike) at 1000° C.

It is found from FIG. 11C, that the effective work function is improved to 4.8 eV by using the TiAlN film (Al concentration: 30%) in this example as the metal gate electrode.

Example 7

As an example 7 of the present invention, an evaluation of pMOS application wherein the TiAlN film formed by repeating the CVD-TiN film formation and the ALD-AlN film formation is applied to the gate electrode of pMOS, will be described. In this evaluation, the effective work function and the EOT were compared respectively in each case of forming the ALD-AlN film firstly (AlN-first) and a case of forming the CVD-TiN film firstly (TiN-first) on the high dielectric constant gate insulating film when the TiAlN film was formed.

Figure 12:
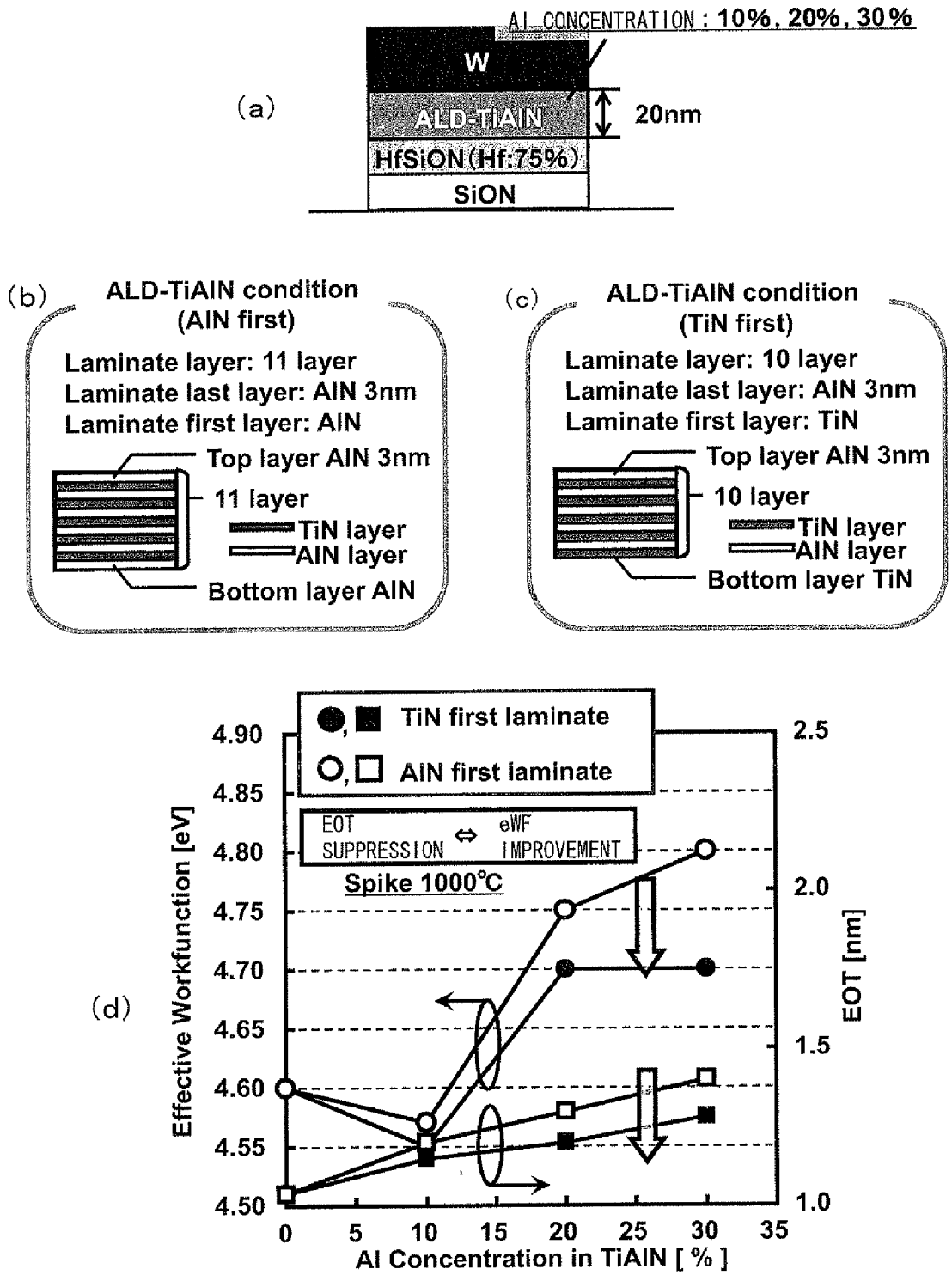
Figure 13:
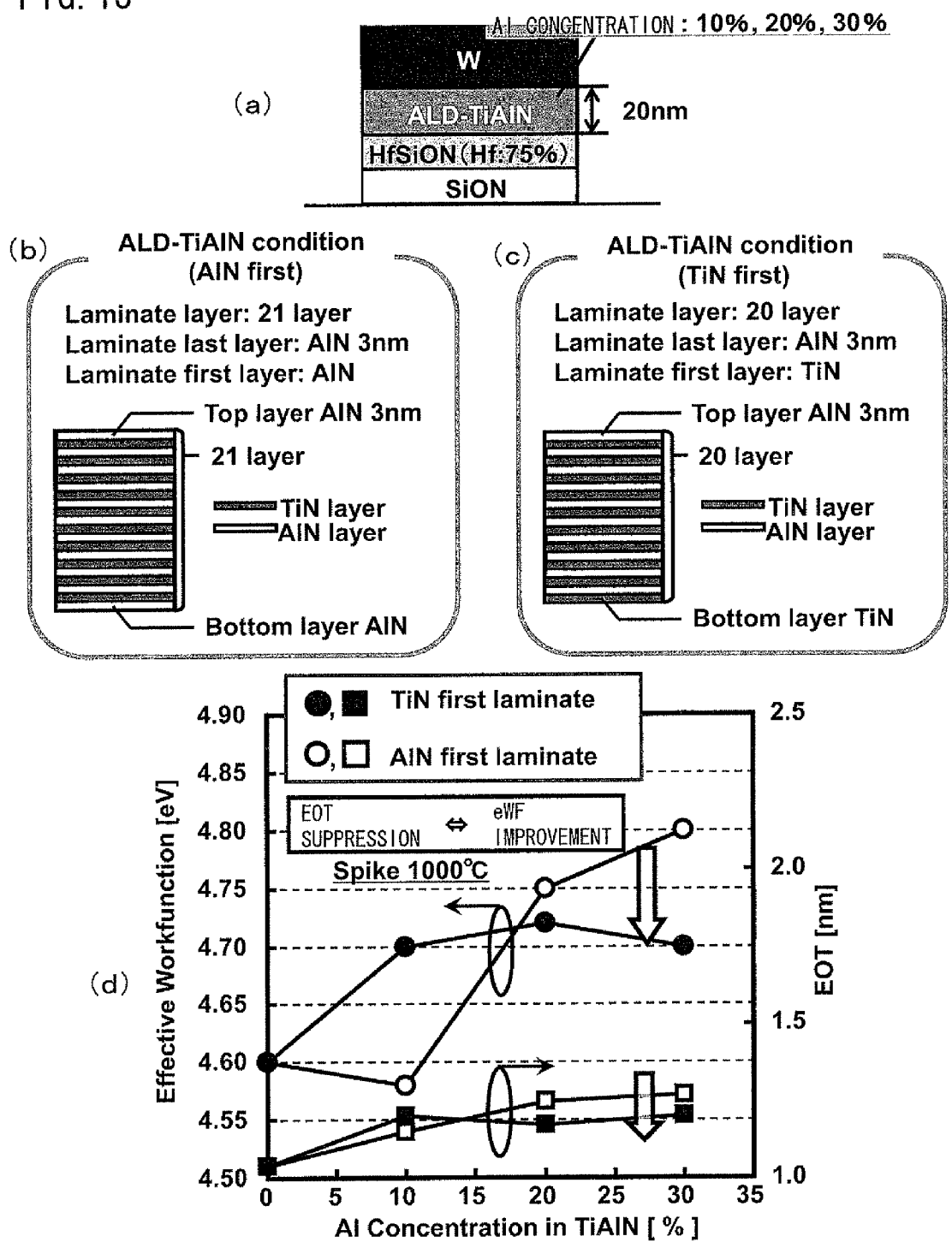

FIG. 12A and FIG. 13A show an evaluation sample structure, and shows the gate structure of p-MOSFET wherein the TiAlN film formed by repeating the CVD-TiN film formation and the ALD-AlN film formation is applied to the gate electrode. Specifically, FIG. 12A and FIG. 13A show a structure in which SiON film is formed on the silicon wafer as the interface layer, and HfSiON film is formed thereon as the high dielectric constant gate insulating film, and TiAlN film and further W film are formed thereon by the aforementioned method as the metal gate electrode (W/TiAlN/HfSiON/

SiON/Si WAFER). In addition, the concentration of Hf in the TiAlN film was set to be 75%. Further, SiO$_2$ film may also be used as the interface layer instead of the SiON film.

FIG. 12B and FIG. 13B show the conditions for forming ALD-TiAlN according to this example, namely, the TiAlN film by repeating the CVD-TiN film formation and the ALD-AlN film formation, and its laminate structure. Note that, in the TiAlN film shown in FIG. 12B, the ALD-AlN film was formed firstly and the CVD-TiN film and the ALD-AlN film were formed by alternately laminating 11-layers of them. Namely, the uppermost layer and the lowermost layer of the laminate film were respectively set as the AlN layers. In addition, the film thickness of the uppermost AlN layer was set to be 3 nm. Further, as shown in FIG. 13B, in the TiAlN film, the ALD-AlN film was formed firstly and the CVD-TiN film and the ALD-AlN film were alternately formed by laminating 21-layers of them. Namely, the lowermost layer and the uppermost layer of the laminate film were respectively set as the AlN layers. In addition, the film thickness of the uppermost AlN layer was set to be 3 nm.

FIG. 12C and FIG. 13C show the conditions for forming ALD-TiAlN according to a comparative example, namely, the TiAlN film by repeating the CVD-TiN film formation and the ALD-AlN film formation, and its laminated structure. Note that in the TiAlN film shown in FIG. 12C, the CVD-TiN film was firstly formed and the CVD-TiN film and the ALD-AlN film were formed by alternately laminating 10-layers of them. Namely, the lowermost layer of the laminate film was set as the TiN layer and the uppermost layer of the laminate film was set as the AlN layer. In addition, the film thickness of the uppermost AlN layer was set to be 3 nm. Further, in the TiAlN film shown in FIG. 13C, the CVD-TiN film was firstly formed, and the CVD-TiN film and the ALD-AlN film were formed by alternately laminating 20-layers of them. Namely, the lowermost layer of the laminate film was set as the TiN layer, and the uppermost layer of the laminate film was set as the AlN layer. In addition, the film thickness of the uppermost AlN layer was set to be 3 nm.

FIG. 12D and FIG. 13D are views showing Al concentration dependency of the effective work function in the TiAlN film. FIG. 12D and FIG. 13D show the Al concentration in TiAlN taken on the horizontal axis, and show the effective work function taken on the vertical axis on the left side, and show the EOT taken on the vertical axis on the right side. Mark ○ and mark □ show the effective work function and EOT when the ALD-AlN film is firstly formed, and mark ● and mark ■ show the effective work function and EOT when the CVD-TiN film is firstly formed, respectively. Note that in this evaluations three kinds of samples, with Al concentration in the TiAlN film changed like 10%, 20%, and 30% were prepared. Moreover, the CVD-TiN film formation and the ALD-AlN film formation in this evaluation were performed, with the processing conditions set in the values within the processing conditions in the aforementioned embodiment. Further, the effective work function shows data after activation annealing (Spike) performed at 1000° C.

As one of the purposes of using the ALD-TiAlN film as the gate electrode, improvement of the effective work function of the gate electrode, achieved by efficiently dispersing Al from the TiAlN film as far as the interface between an interface layer such as the SiON film and the SiO$_2$ film, and the High-k film (high dielectric constant film) such as HfSiON film, can be given. It is found from FIG. 12D and FIG. 13D, that an improvement width of the effective work function is different depending on whether the ALD-AlN film is firstly formed or the CVD-TiN film is firstly formed. Namely, when the ALD-AlN film is firstly formed, Al is easily dispersed from the TiAlN film toward a lower layer direction, and the improvement width of the effective work function is great in both samples of 11-layers and 21-layers, and improvement of 0.2 eV from 4.6 eV to 4.8 eV can be confirmed. Meanwhile, when the CVD-TiN film is firstly formed, Al is hardly dispersed, and it is found that the improvement width of the effective work function is small in both samples of 10-layers and 20-layers. This would be caused by block of the dispersion of Al from the TiAlN film toward the lower layer direction by the firstly formed TiN film (TiN acts as a dispersion block layer for blocking the dispersion of Al by TiN). Generally, the improvement width of the effective work function by dispersing Al is about 0.2 eV, and it is found that Al can be efficiently dispersed when the ALD-AlN film is firstly formed, thus making it easy to exhibit Al doping effect.

Example 8

As an example 8 of the present invention, evaluation of pMOS application wherein the TiAlN film formed by repeating the CVD-TiN film formation and the ALD-AlN film formation is applied to the gate electrode of pMOS, will be described. In this evaluation, oxidation resistance characteristics of the TiAlN film were compared, between a case that the CVD-TiN film was lastly formed (TiN-last) and a case that the ALD-AlN film was lastly formed (AlN-last), when the TiAlN film is formed, namely between a case that the uppermost layer was set as the CVD-TiN film and a case that the uppermost layer was set as the ALD-AlN film.

Figure 14:
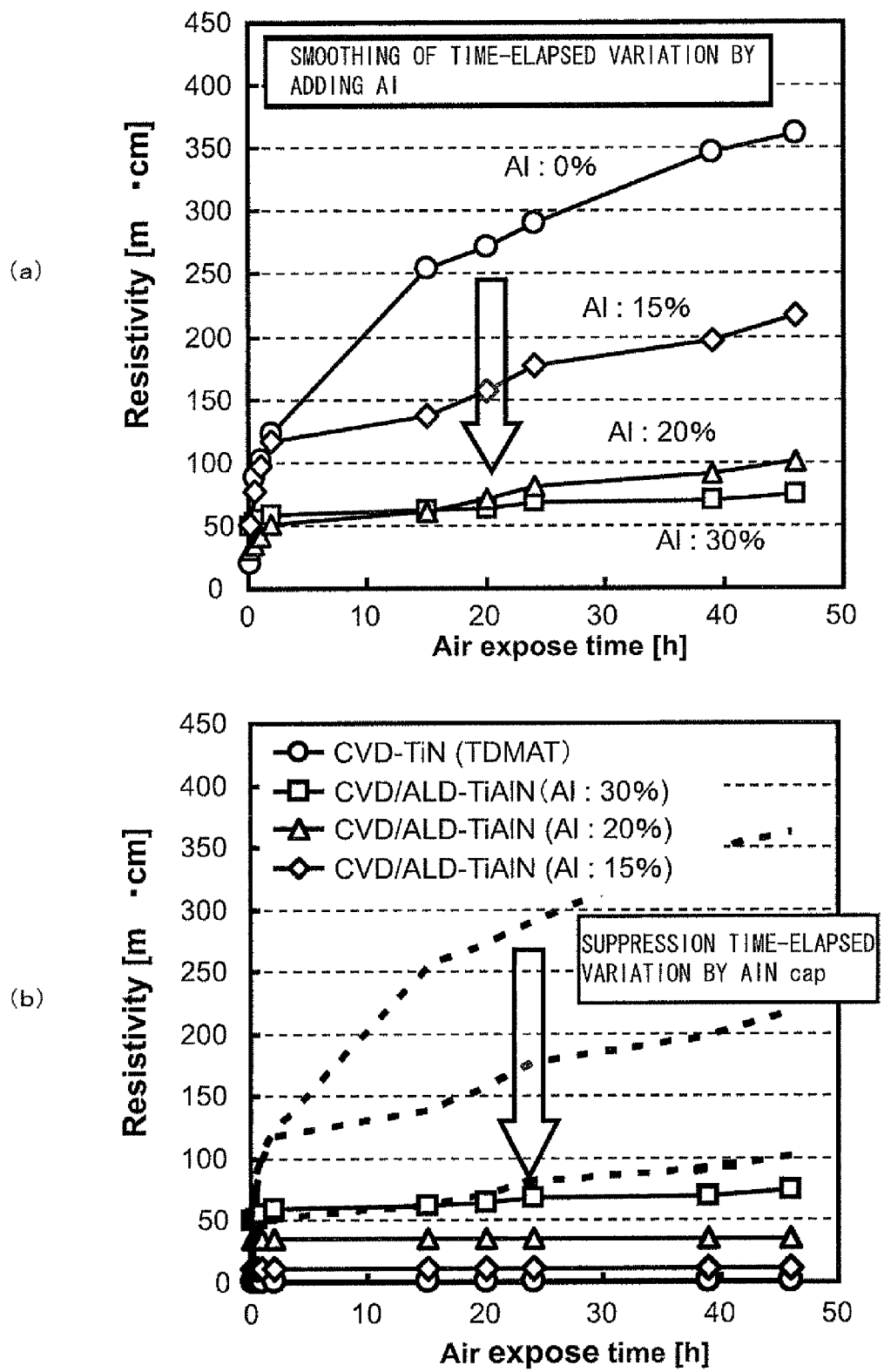
FIG. 14A is a view showing a variation of degree of oxidation of the TiAlN film with elapse of time, with CVD-TiN film set as an uppermost layer.
FIG. 14B is a view showing the variation of the TiAlN film with elapse of time, with ALD-AlN film set as an uppermost layer.

FIG. 14A is a view showing a variation of a degree of oxidation of the TiAlN film with elapse of time, with CVD-TiN film set as the uppermost layer. FIG. 14A shows an expose time of the TiAlN film to atmospheric air after forming the TiAlN film taken on the horizontal axis, and shows electric resistivity of the TiAlN film taken on the vertical axis. In addition, mark ○ in the figure shows the electric resistivity of the CVD-TiN film. Further, the ALD-AlN film is not formed on the uppermost layer, and the content of Al in the CVD-TiN film is 0%. Mark □ in the figure shows the electric resistivity of the TiAlN film, with the uppermost layer set as the CVD-TiN film, which is formed by alternately repeating the CVD-TiN film formation and the ALD-AlN film formation. Note that each ALD-AlN film is formed through ALD cycles of 18-times respectively, and the content of Al in the TiAlN film is 30%. Mark Δ in the figure shows the electric resistivity of the TiAlN film, with the uppermost layer set as the CVD-TiN film, which is formed by alternately repeating the CVD-TiN film formation and the ALD-AlN film formation. In addition, each ALD-AlN film is formed through ALD cycles of 9-times, and the content of Al in the TiAlN film is 20%. Mark ◊ in the figure shows the electric resistivity of the TiAlN film, with the uppermost layer set as the CVD-TiN film, which is formed by alternately repeating the film formation of CVD-TiN film and the film formation of ALD-AlN. Note that each ALD-AlN film is formed through four ALD cycles, and the content of Al in the TiAlN film is 15%.

FIG. 14B is a view showing the variation of the degree of oxidation of the TiAlN film with elapse of time, with the uppermost layer set as the ALD-AlN film. FIG. 14B shows the expose time of the TiAlN film to atmospheric air after forming the TiAlN film, taken on the horizontal axis, and shows the electric resistivity of the TiAlN film taken on the vertical axis, respectively. In addition, mark ○ in the figure shows the electric resistivity of the TiAlN film formed, with the uppermost layer set as the ALD-AlN film, after forming the CVD-TiN film. Note that the uppermost ALD-AlN film is formed through ALD cycles of 18-times. Mark □ in the figure shows the electric resistivity of the TiAlN film, with the uppermost layer set as the ALD-AlN film, which is formed by alternately repeating the CVD-TiN film formation and the ALD-AlN film formation. In addition, each ALD-AlN film is formed through ALD cycles of 18-times respectively, and the content of Al in the TiAlN film is 30%. Mark Δ in the figure shows the electric resistivity of the TiAlN film, with the uppermost layer set as the ALD-AlN film, which is formed by alternately repeating the CVD-TiN film formation and the ALD-AlN film formation. Moreover, the uppermost ALD-AlN film is formed through ALD cycles of 18-times respectively, and the ALD-AlN film lower than this uppermost ALD-AlN film is formed through ALD cycles of 9-times, respectively, and the content of Al in the TiAlN film is 20%. Mark ◇ in the figure shows the electric resistivity of the TiAlN film, with the uppermost layer set as the ALD-AlN film, which is formed by alternately repeating the CVD-TiN film formation and the ALD-AlN film formation. Note that the uppermost ALD-AlN film is formed through ALD cycles of 18-times respectively, and the ALD-AlN film lower than the uppermost ALD-AlN film is formed through ALD cycles of 4-times respectively, and the content of Al in the TiAlN film is 15%.

It is found from FIG. 14A that the electric resistivity is increased with elapse of the expose time to atmospheric air, in the TiAlN film, with the uppermost layer set as the CVD-TiN film, thus making it easy to oxidize the TiAlN film. Meanwhile, it is found from FIG. 14B that the electric resistivity is hardly increased with elapse of the expose time to atmospheric air in the TiAlN film, with the uppermost layer set as the ALD-AlN film, thus making it difficult to oxidize the TiAlN film. The reason therefore is considered as follows. The ALD-AlN film formed on the uppermost layer actions as an oxygen block layer for blocking take-in of the oxygen in the atmospheric air into the CVD-TiN film. Reversely, it is also considered as follows. When the uppermost layer is set as the CVD-TiN film, oxygen in the atmospheric air is easily taken into the CVD-TiN film, thus making it easy to generate oxidation of the TiAlN film. When a lot of oxygen is contained in the gate electrode, oxygen in the gate electrode passes through the High-k film such as HfSiON in the gate electrode by applying heat treatment thereto at high temperature, which is then dispersed as far as the interface layer such as SiON and $SiO_2$, thus increasing EOT as a result, and scaling of a transistor is sometimes inhibited. However, by setting the uppermost layer as the ALD-AlN film, such a problem can be solved.

Further Other Embodiment of the Present Invention

In the aforementioned embodiment, explanation is given for an example of performing film formation by using a single wafer processing apparatus for processing a single substrate at once, as the substrate processing apparatus. However, the present invention is not limited to the aforementioned embodiment. For example, the film formation may be performed by using a butch-type vertical apparatus for processing a plurality of substrates at once as the substrate processing apparatus.

In addition, the aforementioned embodiment describes an example of solving the deterioration of the throughput by improving the film formation rate by combining CVD method and ALD method. However, if the butch-type vertical apparatus is used, even in a case of performing film formation only by ALD method, the deterioration of the throughput can be solved by increasing the number of substrates processed at once. A method of performing film formation only by ALD method using this vertical apparatus, namely, a vertical ALD apparatus, will be described.

Figure 15:
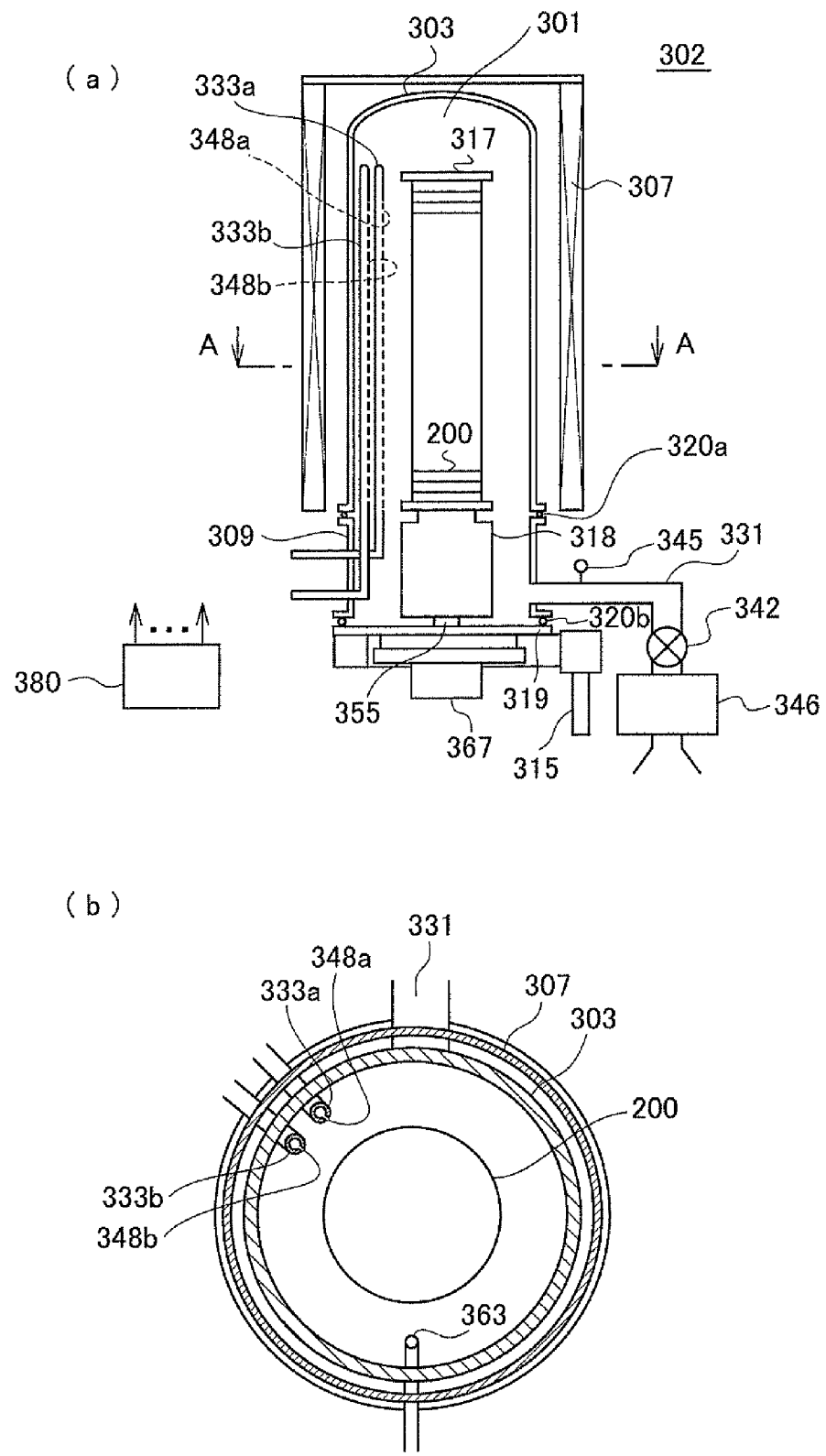

FIG. 15 is a schematic block diagram of a vertical processing furnace of the vertical ALD apparatus suitably used in this embodiment, wherein FIG. 15A shows a vertical sectional view of a processing furnace 302 portion, and FIG. 15B shows a sectional view of the processing furnace 302 portion taken along the line A-A of FIG. 15A.

As shown in FIG. 15A, the processing furnace 302 has a heater 307, being a heating unit (heating mechanism). The heater 307 has a cylindrical shape, and is vertically installed by being supported by a heater base, being a holding plate.

A process tube 303, being a reaction tube, is disposed inside of the heater 307, concentrically with the heater 307. The process tube 303 is made of a heat resistance material such as quartz ($SiO_2$) and silicon carbide (SiC), and is formed into a cylindrical shape, with an upper end closed and a lower end opened. A processing chamber 301 is formed in a cylinder hollow part of the process tube 303, and is constituted so that wafers 200, being substrates, can be housed in a state of being arranged in multiple stages in a horizontal posture in a vertical direction by a boat 317 as will be described later.

A manifold 309 is disposed in a lower part of the process tube 303 concentrically with the process tube 303. The manifold 309 is made of, for example, stainless, etc, and is formed into a cylindrical shape, with the upper end and the lower end opened. The manifold 309 is engaged with the process tube 303, and is provided so as to support the process tube 303. In addition, an O-ring 320a, being a seal member, is provided between the manifold 309 and the process tube 303. The process tube 303 is set in a state of being installed vertically by being supported by the heater base. The reaction vessel is formed by the process tube 303 and the manifold 309.

A first nozzle 333a, being a first gas inlet part, and a second nozzle 333b, being a second gas inlet part, are connected to the manifold 309, so as to pass through a side wall of the manifold 309. The first nozzle 333a and the second nozzle 333b are formed into L-shapes having a horizontal part and a vertical part respectively, with the horizontal part connected to the manifold 309, and the vertical part provided in a arc-shaped space between the inner wall of the process tube 303 and the wafer 200, along the inner wall extending from a lower part to an upper part of the process tube 303, so as to rise toward a laminating direction of the wafer 200. First gas supply holes 348a and second gas supply holes 348b, being supply holes for supplying gas, are respectively provided on the side faces of the vertical parts of the first nozzle 333a and the second nozzle 333b. These first gas supply holes 348a and second gas supply holes 348b are provided further, at the same opening pitch, having the same opening areas extending from the lower part to the upper part respectively.

A gas supply system connected to the first nozzle 333a and the second nozzle 333b is the same as that of the aforementioned embodiment. However, in this embodiment, a first source gas supply system and a second source gas supply system are connected to the first nozzle 333a, and a reactive gas supply system is connected to the second nozzle 333b, and this point is different from the aforementioned embodiment. Namely, in this embodiment, the source gas (first source gas and second source gas) and reactive gas are supplied by different nozzles. In addition, each source gas may be supplied by different nozzles.

An exhaust tube 331 for exhausting an atmosphere in the processing chamber 301 is provided in the manifold 309. A vacuum pump 346, being a vacuum exhaust device, is connected to the exhaust tube 331, through a pressure sensor 345, being a pressure detector, and APC (Auto Pressure Controller) valve 342, being a pressure adjuster, and by adjusting the APC valve 342 based on pressure information detected by the pressure sensor 345, the pressure in the processing chamber 301 can be vacuum-exhausted so as to be set to a prescribed pressure (vacuum degree). In addition, the APC valve 342 serves as an open/close valve capable of starting/stopping vacuum-exhaust of the atmosphere in the processing chamber 301 by opening/closing the APC valve 342, and further capable of adjusting the pressure in the processing chamber 301 by adjusting an opening degree of the valve.

A seal cap 319, being a furnace throat lid member capable of air-tightly closing a lower end opening of the manifold 309. The seal cap 319 is touched on the lower end of the manifold 309 from a vertical lower side. The seal cap 319 is made of metal such as stainless, and is formed into a disc shape. An O-ring 320b, being a seal member touched on the lower end of the manifold 309 is provided on an upper surface of the seal cap 319. A rotation mechanism 367 for rotating a boat 317 as will be described later, is installed on a face of the seal cap 319 which is opposite side of the processing chamber 301. A rotary shaft 355 of the rotation mechanism 367 is passed through the seal cap 319, and is connected to the boat 317, to thereby rotate the wafer 200 by rotating the boat 317. The seal cap 319 is vertically elevated by the boat elevator 315, being an elevating mechanism disposed outside of the process tube 303, so that the boat 317 can be loaded and unloaded into/from the processing chamber 301.

The boat 317, being a substrate holding tool, is made of heat resistance material such as quartz and silicon carbide, and is constituted in such a manner that a plurality of sheets of wafers 200 are arranged, with centers thereof mutually aligned in a horizontal posture and are held in multiple stages. In addition, a heat insulating member 318 made of heat resistance materials such as quartz and silicon carbide is provided in a lower part of the boat 317, so that heat from the heater 307 is hardly transmitted to the seal cap 319 side. A temperature sensor 363, being a temperature detector, is installed in the process tube 303, and by adjusting a power supply state to the heater 307 based on temperature information detected by the temperature sensor 363, the temperature in the processing chamber 301 is set to have a prescribed temperature distribution. The temperature sensor 363 is provided along the inner wall of the process tube 303, in the same way as the first nozzle 333a and the second nozzle 333b.

A controller 380, being a control part (control unit) controls the APC valve 342, heater 307, temperature sensor 363, vacuum pump 346, rotation mechanism 367, boat elevator 315, valves va1 to va4, vb1 to vb4, vc1 to vc2, vd1 to vd2, ve1 to ve2, highly durable high speed gas valve V, flow rate controllers 222a, 222b, 222c, 222d, and 2223.

Figure 16:
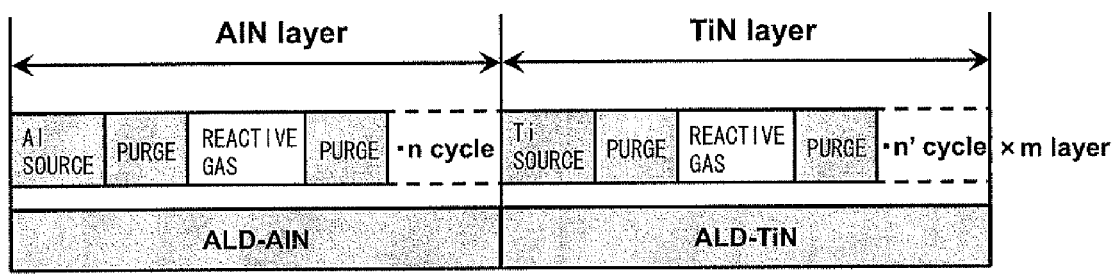
FIG. 16 is a film formation sequence in the substrate processing step according to further another embodiment of the present invention.

Next, the substrate processing step of forming a thin film on the wafer 200 by ALD method will be described with reference to FIG. 16, as one step of the manufacturing steps of the semiconductor device, by using the processing furnace 302 of the vertical ALD apparatus having the aforementioned structure. Here, by alternately repeating the ALD-AlN step and the ALD-TiN step, the TiAlN film is formed on the wafer 200 on which the HfSiON film is formed on the surface through the SiON film, and at that time, the AlN film is formed firstly (AlN-first) and the AlN film is formed lastly (AlN-last). Here, $TiCl_4$, TMA, and $NH_3$ are used respectively as the first source, the second source, and the reactive gas. In addition, in the description hereinafter, the operation of each part constituting the vertical ALD apparatus is controlled by the controller 380.

A plurality of wafers 200 are charged into the boat 317 (wafer charge). Then, as shown in FIG. 15A, the boat 317 holding a plurality of sheets of wafers 200 is elevated by the boat elevator 315 and is loaded into the processing chamber 301 (boat loading). In this state, the seal cap 319 is set in a state of sealing the lower end of the manifold 309 through the O-ring 320b.

The inside of the processing chamber 301 is vacuum-exhausted by the vacuum pump 346, so that the inside of the processing chamber 301 is set to a desired pressure (vacuum degree) At this time, the pressure in the processing chamber 301 is measured by the pressure sensor 345, and based on this measured pressure, the APC valve 342 is feedback-controlled. In addition, the inside of the processing chamber is heated by the heater 307 so as to be a desired temperature. At this time, the power supply state to the heater 307 is feedback-controlled based on the temperature information detected by the temperature sensor 363. Subsequently, the wafer 200 is rotated by rotating the boat 317 by the rotation mechanism 367.

Thereafter, by alternately repeating the ALD-AlN step and the ALD-TiN step, the ALD-AlN film and the ALD-TiN film are alternately laminated on the wafer 200 (HfSiON film), to thereby form the TiAlN film. At that time, by performing the ALD-AlN step firstly, the ALD-AlN film is formed firstly (AlN-first). Further, by performing the ALD-AlN step lastly, the ALD-AlN film is formed lastly (AlN-last). Namely, both of the lowermost layer and the uppermost layer of the TiAlN film are set as the ALD-AlN film.

In addition, the procedure of the ALD-AlN step is the same as the ALD-AlN step (S8) in the aforementioned embodiment. Meanwhile, the procedure of the ALD-TiN step (S6) is different from the CVD-TiN step in the aforementioned embodiment. The ALD-TiN step will be described hereinafter.

(First Source Gas Supplying Step)

In the ALD-TiN step, the valve va4 is closed and the valve va3 is opened, with the vacuum pump 346 operated, and supply of the first source gas (Ti source) into the processing chamber 301 is started. The first source gas is uniformly supplied onto the wafer 200 in the processing chamber 301 through the first nozzle 333a. The excess first source gas is exhausted to the exhaust tube 331 (first source gas supplying step). At this time, the processing temperature and the processing pressure are set to be the processing temperature and the processing pressure not allowing the first source gas to be self-decomposed. Therefore, gas molecules of the first source gas are adsorbed on the AlN film formed on the wafer 200 in the ALD-AlN step. When prescribed time is elapsed after supply of the first source gas is started by opening the valve va3, the valve va3 is closed and the valve va4 is opened, to thereby stop the supply of the first source gas into the processing chamber 301. Also, simultaneously, the valve va1 and the valve va2 are closed, to thereby stop the supply of the carrier gas to the first bubbler 220a.

(Purging Step)

After the valve va3 is closed and the supply of the first source gas is stopped, the valves vd1, vd2, ve1, and ve2 are opened, to thereby supply $N_2$ gas into the processing chamber 301. The $N_2$ gas is supplied into the processing chamber 301 through the first nozzle 333a and the second nozzle 333b, and is exhausted to the exhaust tube 331. Thus, the first source gas remained in the processing chamber 301 is removed, and the inside of the processing chamber 301 is purged by $N_2$ gas.

(Reactive Gas Supplying Step)

When purging inside of the processing chamber 301 is completed, the valves vc1 and vc2 are opened, and supply of the reactive gas (NH$_3$ gas) into the processing chamber 301 is started. The reactive gas is uniformly supplied onto the wafer 200 in the processing chamber 301 through the second nozzle 333b, and is reacted with the gas molecules of the first source gas adsorbed on the AlN film formed on the wafer 200 in the ALD-AlN step, to thereby generate the TiN film of about less than one atomic layer (less than 1 Å) on the AlN film. The excess reactive gas and the reaction by-product are exhausted to the exhaust tube 331 (reactive gas supplying step). When prescribed time is elapsed after supply of the reactive gas is started by opening the valves vc1 and vc2, the valves vc1 and vc2 are closed, to thereby stop the supply of the reactive gas into the processing chamber 301.

(Purging Step)

After supply of the reactive gas is stopped by closing the valves vc1 and vc2, the valves vd1, vd2, ve1, and ve2 are opened, to thereby supply N$_2$ gas into the processing chamber 301. The N$_2$ gas is supplied into the processing chamber 301 through the first nozzle 333a and the second nozzle 333b, and is exhausted to the exhaust tube 331. Thus, the reactive gas and the reaction by-product remained in the processing chamber 301 are removed, and the inside of the processing chamber 301 is purged by N$_2$ gas.

(Cycle Processing)

By performing cycle processing of executing prescribed number of times of ALD cycles, with the aforementioned first source gas supplying step, purging step, reactive gas supplying step, and purging step, set as one cycle, the TiN film of a desired film thickness, is formed on the TiN film formed on the wafer 200 in the ALD-AlN step.

After the TiAlN film of a prescribed film thickness is formed on the wafer 200 (HfSiON film) by alternately repeating the ALD-AlN step and the ALD-TiN step for prescribed number of times, the seal cap 319 is lowered by the boat elevator 315, and the lower end of the manifold 309 is opened and the wafer, with TiAlN film of a prescribed film thickness formed thereon, is unloaded to outside of the process tube 303 from the lower end of the manifold 309 in a state of being held by the boat 317 (boat unloading). Thereafter, the already processed wafer 200 is taken out from the boat 317 (wafer discharge).

According to an example given by this embodiment, by alternately repeating the ALD-AlN step and the ALD-TiN step, the TiAlN film is formed on the wafer 200 by using the vertical ALD apparatus, and at that time, the AlN film is formed firstly and lastly. However, the present invention is not limited thereto. For example, by alternately repeating the ALD-AlN step and the CVD-TiN step, the TiAlN film is formed on the wafer 200 by using the vertical ALD apparatus, and at that time, the AlN film may be formed firstly and lastly. In this case, the film-forming rate can be improved and throughput can be further improved more than a case that film formation is performed only by ALD method.

<Preferred Aspects of the Present Invention>

Preferred aspects of the present invention will be additionally described hereinafter.

According to one of the aspects of the present invention, there is provided a manufacturing method of a semiconductor device, including the steps of:

forming an insulating film on a substrate;

forming a high dielectric constant insulating film on the insulating film; and forming a titanium aluminum nitride film on the high dielectric constant insulating film, wherein in the step of fowling the titanium aluminum nitride film, formation of an aluminum nitride film and formation of a titanium nitride film are alternately repeated, and at that time, the aluminum nitride film is formed firstly and/or lastly.

Preferably, the aluminum nitride film is formed by ALD method, and the titanium nitride film is formed by ALD method or CVD method, and the formation of the aluminum nitride film and the formation of the titanium nitride film are performed in the same processing chamber, with the temperature of the substrate set to be the same temperature.

Also preferably, the aluminum nitride film is formed by setting the step of supplying a source containing aluminum atoms and the step of supplying gas containing nitrogen atoms as one cycle, and repeating this cycle multiple number of times, and by changing the number of times of the cycle, concentration of the aluminum atoms in the titanium aluminum nitride film is controlled.

Also preferably, the insulating film is a silicon oxide film or a silicon oxynitride film, and the high dielectric constant insulating film is a hafnium silicate nitride film.

According to another aspect of the present invention, there is provided a manufacturing method of a semiconductor device, including the steps of:

forming an insulating film on a substrate;

forming a high dielectric constant insulating film on the insulating film; and forming a titanium aluminum nitride film on the high dielectric constant insulating film, wherein in the step of forming the titanium aluminum nitride film, formation of an aluminum nitride film by ALD method and formation of a titanium nitride film by CVD method are alternately repeated in the same processing chamber, with purging of an inside of the processing chamber inserted therebetween, in a state of setting temperature of the substrate to the same temperature, and at that time, the aluminum nitride film is formed firstly and/or lastly.

Preferably, the formation of the aluminum nitride film and the formation of the titanium nitride film are performed in a state of setting a pressure in the processing chamber to the same pressure.

Also preferably, the aluminum nitride film is formed by setting the step of supplying a source containing aluminum atoms and the step of supplying gas containing nitrogen atoms as one cycle, and repeating this cycle multiple number of times, and by changing the number of times of the cycle, concentration of the aluminum atoms in the titanium aluminum nitride film is controlled.

Also preferably, the insulating film is a silicon oxide film or a silicon oxynitride film, and the high dielectric constant insulating film is a hafnium silicate nitride film.

According to further another aspect of the present invention, there is provided a substrate processing apparatus, including:

a processing chamber that processes a substrate on which a high dielectric constant insulating film is formed on a surface through an insulating film;

a first source supply system that supplies a first source containing aluminum atoms into the processing chamber;

a second source supply system that supplies a second source containing titanium atoms into the processing chamber;

a reactive gas supply system that supplies reactive gas containing nitrogen atoms into the processing chamber;

a heater that heats the substrate in the processing chamber; and a controller that controls the first source supply system, the second source supply system, the reactive gas supply system, and the heater, so as to faun a titanium aluminum nitride film on the high dielectric constant insulating film formed on the substrate by alternately and repeatedly performing formation of an aluminum nitride film by supplying the first source and the reactive gas into the processing chamber, and formation of a titanium nitride film by supplying the second source and the reactive gas into the processing chamber, and at that time, so as to form the aluminum nitride film firstly and/or lastly.

According to further another aspect of the present invention, there is provided a semiconductor device, including:
 an insulating film formed on a substrate;
 a high dielectric constant insulating film formed on the insulating film; and
 a titanium aluminum nitride film formed on the high dielectric constant insulating film,
 wherein the titanium aluminum nitride film is composed of a laminated film of an aluminum nitride film and a titanium nitride film, and a lowermost layer and/or an uppermost layer of the titanium aluminum nitride film is the aluminum nitride film.

According to an aspect of the present invention, there is provided a manufacturing method of a semiconductor device, including the steps of:
 forming a third metal film containing first metal atoms and second metal atoms, by alternately repeating the step of forming on a substrate a first metal film containing the first metal atoms by CVD method, and the step of forming on the substrate a second metal film containing the second metal atoms by ALD method.

Preferably, the step of forming the first metal film and the step of forming the second metal film are continuously performed in the same processing chamber.

Also preferably, the step of forming the first metal film and the step of forming the second metal film are performed at the same processing temperature and/or under the same processing pressure.

Also preferably, in the step of forming the first metal film, a first source containing the first metal atoms is supplied to a substrate, and in the step of forming the second metal film, the step of supplying a second source containing the second metal atoms to the substrate and the step of supplying reactive gas to the substrate are set as one cycle, and this cycle is repeated multiple number of times.

Also preferably, by changing the number of the cycles in the step of forming the second metal film, concentration of the second metal atoms in the third metal film is controlled.

Also preferably, the first metal atoms are titanium atoms (Ti), and the second metal atoms are aluminum atoms (Al).

Also preferably, the first metal film is a titanium nitride film (TiN film), the second metal film is an aluminum nitride film (AlN film), and the third metal film is an aluminum titanium nitride film (TiAlN film).

According to another aspect of the present invention, there is provided a substrate processing apparatus, including:
 a processing chamber that processes a substrate;
 a first source supply system that supplies a first source containing first metal atoms into the processing chamber;
 a second source supply system that supplies a second source containing second metal atoms into the processing chamber;
 a reactive gas supply system that supplies reactive gas into the processing chamber;
 a heater that heats the substrate in the processing chamber; and
 a controller that controls the first source supply system, the second source supply system, the reactive gas supply system, and the heater, so that a first metal film containing the first metal atoms is formed on the substrate by a CVD method by supplying the first source into the processing chamber, then a second metal film containing the second metal atoms is formed on the substrate by an ALD method by supplying the second source and the reactive gas alternately into the processing chamber, and a third metal film containing the first metal atoms and the second metal atoms is formed by alternately repeating the aforementioned CVD method and the ALD method.

What is claimed is:

1. A method of manufacturing a semiconductor device, comprising:
 forming an insulating film on a substrate;
 forming a high dielectric constant insulating film on the insulating film; and
 forming a titanium aluminum nitride film on the high dielectric constant insulating film,
 wherein in forming the titanium aluminum nitride film, formation of an aluminum nitride film and formation of a titanium nitride film are alternately repeated, and at that time, the aluminum nitride film is formed firstly and/or lastly.

2. The method of claim 1, wherein the aluminum nitride film is formed by ALD method, and the titanium nitride film is formed by ALD method or CVD method, and the formation of the aluminum nitride film and the formation of the titanium nitride film are performed in the same processing chamber, with the temperature of the substrate set to be the same temperature.

3. The method of claim 1, wherein the aluminum nitride film is formed by setting
 supplying a source containing aluminum atoms and
 supplying gas containing nitrogen atoms
as one cycle, and repeating this cycle multiple number of times, and by changing the number of times of the cycle, concentration of the aluminum atoms in the titanium aluminum nitride film is controlled.

4. The method of claim 1, wherein the insulating film is a silicon oxide film or a silicon oxynitride film, and the high dielectric constant insulating film is a hafnium silicate nitride film.

5. A method of manufacturing a semiconductor device, comprising
 forming an insulating film on a substrate;
 forming a high dielectric constant insulating film on the insulating film; and
 forming a titanium aluminum nitride film on the high dielectric constant insulating film,
 wherein in forming the titanium aluminum nitride film, formation of an aluminum nitride film by ALD method and formation of a titanium nitride film by CVD method are alternately repeated in the same processing chamber, with purging an inside of the processing chamber inserted therebetween, in a state of setting temperature of the substrate to the same temperature, and at that time, the aluminum nitride film is formed firstly and/or lastly.

6. The method of claim 5, wherein the formation of the aluminum nitride film and the formation of the titanium nitride film are performed in a state of setting a pressure in the processing chamber to the same pressure.

7. The method of claim 5, wherein the aluminum nitride film is formed by setting
 supplying a source containing aluminum atoms and
 supplying gas containing nitrogen atoms
as one cycle, and repeating this cycle multiple number of times, and by changing the number of times of the cycle, concentration of the aluminum atoms in the titanium aluminum nitride film is controlled.

8. The method of claim 5, wherein the insulating film is a silicon oxide film or a silicon oxynitride film, and the high dielectric constant insulating film is a hafnium silicate nitride film.

9. The method of claim 1, wherein in forming the titanium aluminum nitride film, the aluminum nitride film is formed firstly.

10. The method of claim 1, wherein in forming the titanium aluminum nitride film, the aluminum nitride film is formed lastly.

11. The method of claim 1, wherein in forming the titanium aluminum nitride film, the aluminum nitride film is formed firstly and lastly.

12. The method of claim 1, further comprising applying annealing to the substrate after forming the titanium aluminum nitride film.

13. The method of claim 12, wherein the annealing is applied to the substrate in a state that a temperature of the substrate is set to a higher temperature than a temperature of the substrate at the time of forming the titanium aluminum nitride film.

14. The method of claim 12, wherein the annealing is applied to the substrate at a temperature of at least 1000° C.

15. The method of claim 14, wherein in forming the titanium aluminum nitride film, a temperature of the substrate is set to 250 to 450° C.

16. The method of claim 5, wherein in forming the titanium aluminum nitride film, a temperature of the substrate is set to 250 to 450° C.

17. The method of claim 16, wherein in forming the titanium aluminum nitride film, a pressure in the processing chamber is set to 30 to 266 Pa.

18. The method of claim 1, wherein the high dielectric constant insulating film is formed as a gate insulating film, and the titanium aluminum nitride film is formed as a gate electrode.

19. The method of claim 1, wherein the insulating film is formed as an interface layer between the substrate and the high dielectric constant insulating film, and the high dielectric constant insulating film is formed as a gate insulating film, and the titanium aluminum nitride film is formed as a gate electrode.

20. A method of manufacturing a semiconductor device, comprising:
    forming an insulating film on a substrate, the insulating film containing a silicon oxide film or a silicon oxynitride film;
    forming a high dielectric constant gate insulating film on the insulating film;
    forming a titanium aluminum nitride film on the high dielectric constant gate insulating film; and
    applying annealing to the substrate,
    wherein in forming the titanium aluminum nitride film, formation of an aluminum nitride film and formation of a titanium nitride film are alternately repeated, and at that time, the aluminum nitride film is formed firstly and/or lastly.

* * * * *